US010530297B2

(12) United States Patent
Zhang et al.

(10) Patent No.: US 10,530,297 B2
(45) Date of Patent: Jan. 7, 2020

(54) SEMICONDUCTOR DEVICE AND CONTROL METHOD OF SEMICONDUCTOR DEVICE

(71) Applicant: RENESAS ELECTRONICS CORPORATION, Tokyo (JP)

(72) Inventors: Guoqiang Zhang, Tokyo (JP); Kosuke Yayama, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/928,948

(22) Filed: Mar. 22, 2018

(65) Prior Publication Data
US 2018/0351509 A1 Dec. 6, 2018

(30) Foreign Application Priority Data

May 30, 2017 (JP) .................................. 2017-106592

(51) Int. Cl.
*H03B 5/04* (2006.01)
*H03B 5/12* (2006.01)
(52) U.S. Cl.
CPC ............. *H03B 5/04* (2013.01); *H03B 5/1206* (2013.01); *H03B 5/1228* (2013.01); *H03B 5/1231* (2013.01)
(58) Field of Classification Search
CPC ....................................................... H03B 5/04
USPC ................................................... 331/70, 176
See application file for complete search history.

(56) References Cited

U.S. PATENT DOCUMENTS

| 6,020,792 | A | 2/2000 | Nolan et al. |
| 6,828,847 | B1 | 12/2004 | Marinca |
| 2011/0248786 | A1* | 10/2011 | Sako ........................ H03L 7/00 331/34 |

(Continued)

FOREIGN PATENT DOCUMENTS

| JP | 11-298299 A | 10/1999 |
| JP | 2006-519433 A | 8/2006 |

OTHER PUBLICATIONS

J. Lee and S. H. Cho, "A 10MHz 80uW 67ppm/° C. CMOS reference clock oscillator with a temperature compensated feedback loop in 0.18um CMOS,"Symp. on VLSI Circuits, pp. 226-227, 2009.

*Primary Examiner* — Joseph Chang
(74) *Attorney, Agent, or Firm* — McDermott Will & Emery LLP

(57) ABSTRACT

A semiconductor device includes a reference voltage generation circuit configured to generate reference voltages Va and Vb capable of adjusting a primary temperature characteristic, and an oscillation circuit configured to output an oscillation signal using the reference voltages Va and Vb, in which the oscillation circuit includes a frequency/current conversion circuit that is driven by the reference voltage Va and outputs a current Ie in accordance with a frequency of a feedback signal, a control voltage generation circuit configured to generate a control voltage in accordance with a potential difference between a voltage in accordance with the current Ie and the reference voltage Vb, a voltage control oscillation circuit configured to output the oscillation signal having a frequency in accordance with the control voltage, and a frequency division circuit configured to divide a frequency of the oscillation signal and output the resulting signal as the feedback signal.

12 Claims, 13 Drawing Sheets

(56) References Cited

U.S. PATENT DOCUMENTS

2012/0319793 A1\* 12/2012 Iwasa ..................... H03K 3/011
                                                                         331/176
2014/0091780 A1\* 4/2014 Hu ......................... G05F 1/462
                                                                         323/314

\* cited by examiner

SEMICONDUCTOR DEVICE AND CONTROL METHOD OF SEMICONDUCTOR DEVICE

CROSS-REFERENCE TO RELATED APPLICATIONS

This application is based upon and claims the benefit of priority from Japanese patent application No. 2017-106592, filed on May 30, 2017, the disclosure of which is incorporated herein in its entirety by reference.

BACKGROUND

The present disclosure relates to a semiconductor device and a control method of the semiconductor device, and relates to, for example, a semiconductor device and a control method of the semiconductor device suitable for outputting an oscillation signal having a stable oscillation frequency regardless of a temperature.

It is required that an oscillation circuit output an oscillation signal having a stable oscillation frequency regardless of the temperature. For example, J. Lee and S. H. Cho, "A 10 MHz 80 µW 67 ppm/° C. CMOS reference clock oscillator with a temperature compensated feedback loop in 0.18 µm CMOS," Symp. on VLSI Circuits, pp. 226-227, 2009. and Japanese Unexamined Patent Application Publication No. 11-298299 disclose suppressing temperature characteristics of an oscillation frequency.

Further, Published Japanese Translation of PCT International Publication for Patent Application, No. 2006-519433 discloses correcting a curvature of a reference voltage.

SUMMARY

However, the configuration disclosed by J. Lee and S. H. Cho, "A 10 MHz 80 µW 67 ppm/° C. CMOS reference clock oscillator with a temperature compensated feedback loop in 0.18 µm CMOS," Symp. on VLSI Circuits, pp. 226-227, 2009. and the configuration disclosed by Japanese Unexamined Patent Application Publication No. 11-298299 both have a problem that it is impossible to make the oscillation frequency sufficiently stable since only a primary temperature characteristic of an oscillation frequency is suppressed while a secondary temperature characteristic thereof is not suppressed. The other problems of related art and novel characteristics of the present disclosure will be made apparent from the descriptions of the specification and the accompanying drawings.

According to one embodiment, a semiconductor device includes: a reference voltage generation circuit configured to generate first and second reference voltages capable of adjusting a primary temperature characteristic; and an oscillation circuit configured to output an oscillation signal using the first and second reference voltages, in which the oscillation circuit includes: an RC conversion circuit that is driven by the first reference voltage and outputs a current in accordance with a frequency of a feedback signal; a control voltage generation circuit configured to generate a control voltage in accordance with a potential difference between a voltage in accordance with the current output from the conversion circuit and the second reference voltage; a voltage control oscillation circuit configured to output an oscillation signal having a frequency in accordance with the control voltage; and a frequency division circuit configured to divide a frequency of the oscillation signal and output the resulting signal as the feedback signal.

According to another embodiment, a semiconductor device includes: first and second reference current generation circuits configured to generate first and second reference currents capable of adjusting a primary temperature characteristic; and an oscillation circuit configured to output an oscillation signal using the first and second reference currents, in which the oscillation circuit includes: a first resistance element configured to convert the first reference current to a voltage; first and second capacitance elements; a switch unit configured to switch, with respect to first and second capacitance elements, discharging and charging by a charge of the second reference current based on an oscillation signal in a complementary manner; a first comparator configured to compare a voltage output from the first resistance element with a voltage of the first capacitance element and output a first comparison result; a second comparator configured to compare a voltage output from the first resistance element with a voltage of the second capacitance element and output a second comparison result; and an SR latch circuit configured to output the oscillation signal by using the first comparison result as a set signal and using the second comparison result as a reset signal.

Further, according to one embodiment, a control method of a semiconductor device includes: adjusting a primary temperature characteristic and generating first and second reference voltages; outputting a current in accordance with a frequency of a feedback signal by driving an RC conversion circuit by the first reference voltage; generating a control voltage in accordance with a potential difference between a voltage in accordance with the current output from the conversion circuit and the second reference voltage; outputting an oscillation signal having a frequency in accordance with the control voltage; and dividing a frequency of the oscillation signal and outputting the resulting signal as the feedback signal.

According to another embodiment, a control method of a semiconductor device includes: adjusting a primary temperature characteristic to generate first and second reference currents; converting the first reference current to a voltage using a resistance element; switching, with respect to first and second capacitance elements, discharging and charging by a charge of the second reference current in a complementary manner based on an oscillation signal; comparing the voltage output from the resistance element with the voltage of the first capacitance element and outputting a first comparison result; comparing the voltage output from the resistance element with the voltage of the second capacitance element and outputting a second comparison result; and outputting the oscillation signal based on the first and second comparison results.

According to the embodiment, it is possible to provide a semiconductor device capable of outputting an oscillation signal having a stable oscillation frequency regardless of the temperature.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
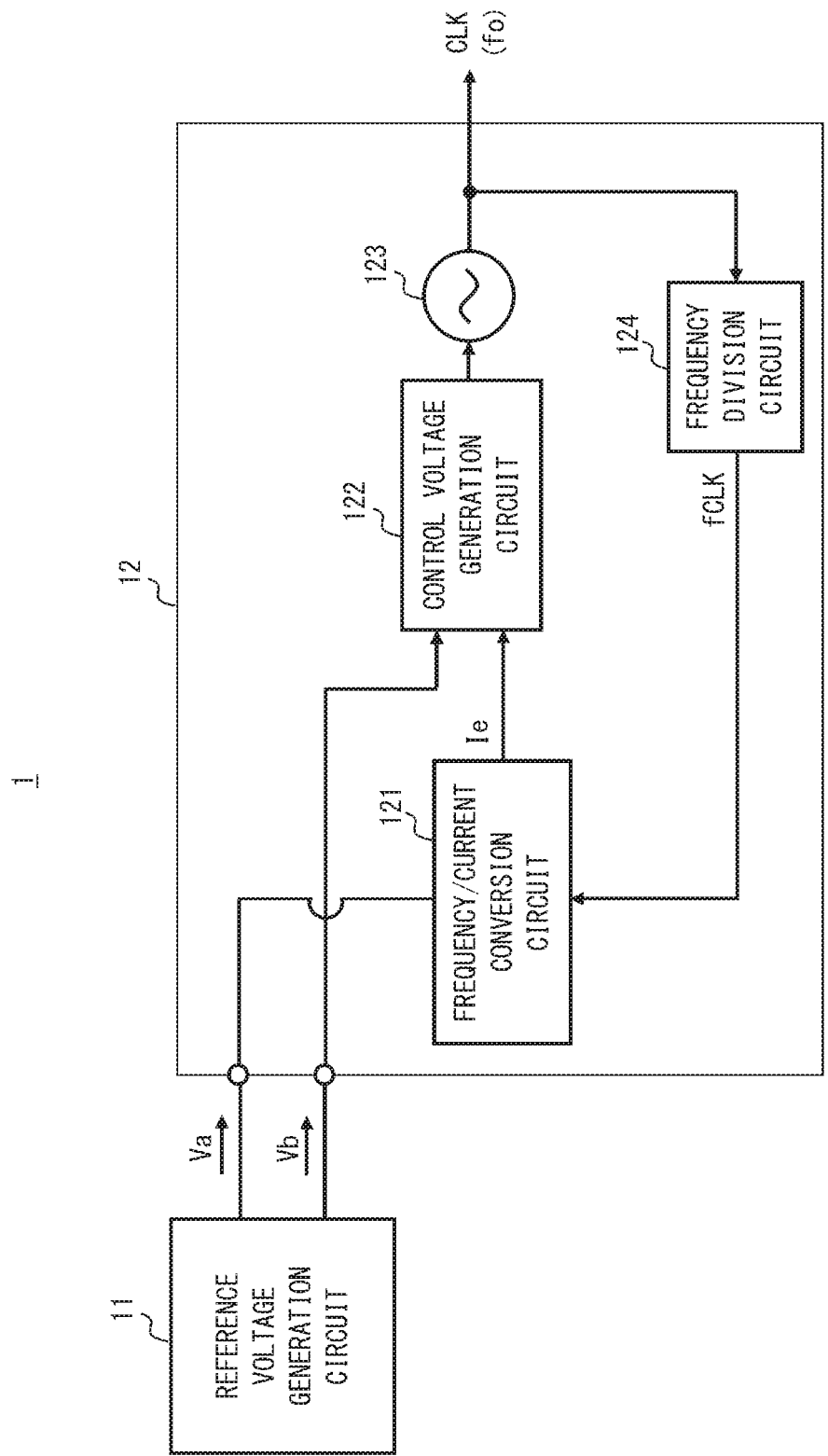
FIG. 1 is a block diagram showing a configuration example of a semiconductor device according to a first embodiment.

Embodiments of the present disclosure will be explained below with reference to the accompanying drawings. Note that the drawings are in simplified form, and the technical scope of the embodiments should not be interpreted to be limited to the drawings. The same elements are denoted by the same reference numerals, and a duplicate description is omitted.

In the following embodiments, when necessary, the present disclosure is explained by using separate sections or separate embodiments. However, those embodiments are not unrelated with each other, unless otherwise specified. That is, they are related in such a manner that one embodiment is a modified example, an application example, a detailed example, or a supplementary example of a part or the whole of another embodiment. Further, in the following embodiments, when the number of elements or the like (including numbers, values, quantities, ranges, and the like) is mentioned, the number is not limited to that specific number except for cases where the number is explicitly specified or the number is obviously limited to a specific number based on its principle. That is, a larger number or a smaller number than the specific number may also be used.

Further, in the following embodiments, the components (including operation steps and the like) are not necessarily indispensable except for cases where the component is explicitly specified or the component is obviously indispensable based on its principle. Similarly, in the following embodiments, when a shape, a position relation, or the like of a component(s) or the like is mentioned, shapes or the like that are substantially similar to or resemble that shape are also included in that shape except for cases where it is explicitly specified or they are eliminated based on its principle. This is also true for the above-described number or the like (including numbers, values, quantities, ranges, and the like).

<First Embodiment>

FIG. 1 is a block diagram showing a configuration example of a semiconductor device 1 according to a first embodiment. The semiconductor device 1 according to this embodiment is an oscillator that outputs an oscillation signal having an oscillation frequency fo. By using two kinds of reference voltages Va and Vb capable of adjusting a primary temperature characteristic, not only the primary temperature characteristic of the oscillation frequency fo but also a secondary temperature characteristic of the oscillation frequency fo are suppressed. Accordingly, the semiconductor device 1 according to this embodiment is capable of outputting an oscillation signal having a stable oscillation frequency regardless of a temperature. This point will be explained hereinafter in detail.

As shown in FIG. 1, the semiconductor device 1 includes a reference voltage generation circuit 11 and an oscillation circuit 12. The reference voltage generation circuit 11 generates two kinds of reference voltages Va and Vb capable of separately adjusting the primary temperature characteristic. The oscillation circuit 12 is an RC oscillation circuit, and outputs an oscillation signal CLK having the oscillation frequency fo by using the reference voltages Va and Vb.

(Specific Configuration Example of Reference Voltage Generation Circuit 11)

Figure 2:
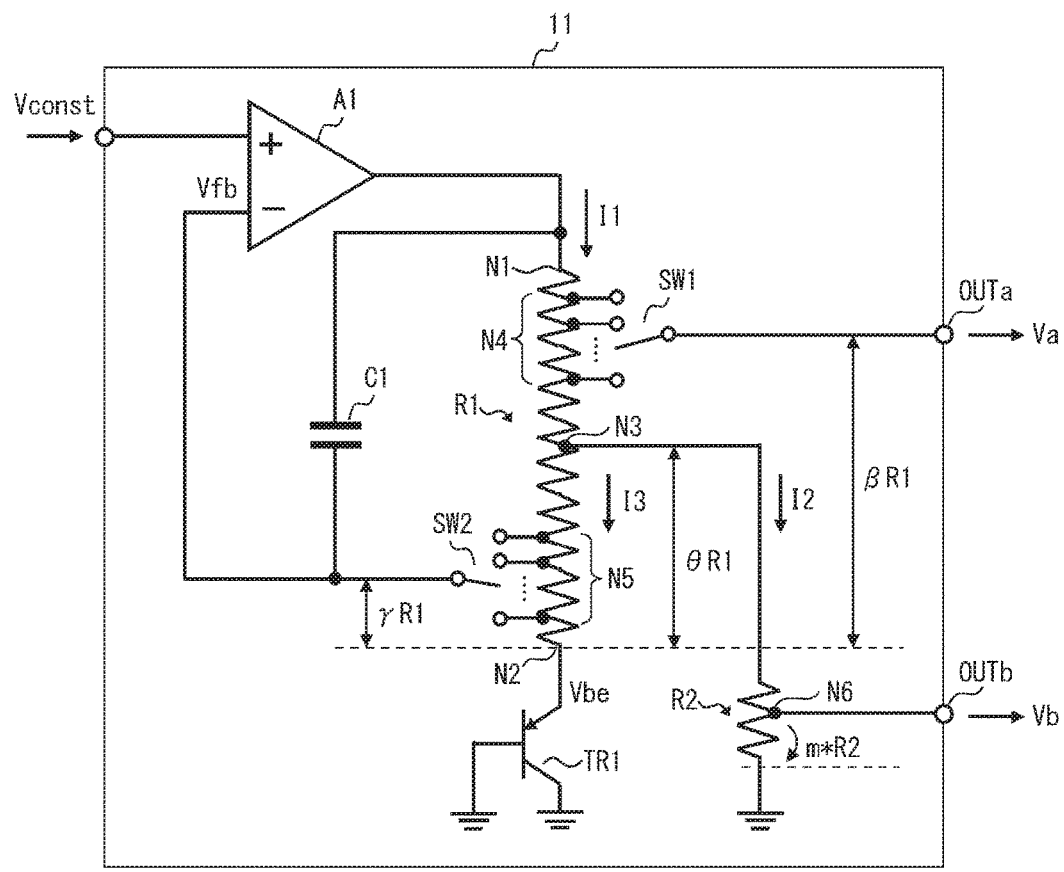
FIG. 2 is a diagram showing a specific configuration example of a reference voltage generation circuit provided in the semiconductor device shown in FIG. 1.

FIG. 2 is a diagram showing a specific configuration example of the reference voltage generation circuit 11.

As shown in FIG. 2, the reference voltage generation circuit 11 includes an operational amplifier A1, resistance elements R1 and R2, a capacitance element C1, a bipolar transistor TR1, and switch elements SW1 and SW2. In this embodiment, a case in which the bipolar transistor TR1 is a PNP bipolar transistor will be explained as an example.

The non-inverting input terminal of the operational amplifier A1 is supplied with a constant voltage Vconst from the outside, the inverting input terminal of the operational amplifier A1 is supplied with a feedback voltage Vfb, and a voltage such that there is no potential difference between the constant voltage Vconst and the feedback voltage Vfb is output from the output terminal of the operational amplifier A1. It is sufficient that the temperature characteristics of the constant voltage Vconst be at least smaller than the temperature characteristics of the reference voltages Va and Vb, and may be, for example, within the range of ±2% from the reference value.

One end (node N1) of the resistance element R1 is connected to the output terminal of the operational amplifier A1 and the other end (node N2) of the resistance element R1 is connected to the emitter of the bipolar transistor TR1. Both the base and the collector of the bipolar transistor TR1 are connected to the ground voltage terminal GND.

The switch element SW1 selects one of a plurality of nodes N4 provided on the resistance element R1 and connects the selected one to an external output terminal OUTa. The voltage of the node N4 selected by the switch element SW1 is output to the outside of the reference voltage generation circuit 11 via the external output terminal OUTa as the reference voltage Va.

The switch element SW2 selects one of a plurality of nodes N5 provided on the resistance element R1 and connects the selected one to the inverting input terminal of the operational amplifier A1. The voltage of the node N5 selected by the switch element SW2 is used as the feedback voltage Vfb.

The capacitance element C1 is provided between the output terminal and the inverting input terminal of the operational amplifier A1. If the capacitance element C1 is not provided, the second pole moves to a low-frequency region due to the influences of the resistance element R1 and the parasitic capacitance thereof, which may cause the operation of the operational amplifier A1 to become unstable. In order to address this problem, in this embodiment, the capacitance element C1 is provided between the output terminal and the inverting input terminal of the operational amplifier A1, whereby the resistance element R1 can be short-circuited with respect to an AC signal. Accordingly, it is possible to stabilize the operation of the operational amplifier A1.

The resistance element R2 is provided between a node N3 on the resistance element R1 and the ground voltage terminal GND. Further, a node N6 provided on the resistance element R2 and an external output terminal OUTb are connected to each other. The voltage of the node N6 on the resistance element R2 is output to the outside of the reference voltage generation circuit 11 via the external output terminal OUTb as the reference voltage Vb.

In the following description, (the resistance value between the end of the resistance element R2 on the GND side and the node N6)/(the total resistance value of the resistance element R2) is referred to as a resistance rate m. Further, (the resistance value between the node N2 and the node N3 of the resistance element R1)/(the total resistance value of the resistance element R1) is referred to as a resistance rate θ. Further, (the resistance value between the node N2 of the resistance element R1 and the node N5 selected by the switch element SW2)/(the total resistance value of the resistance element R1) is referred to as a resistance rate γ. Further, (the resistance value between the node N2 of the resistance element R1 and the node N4 selected by the switch element SW1)/(the total resistance value of the resistance element R1) is referred to as a resistance rate β.

Figure 3:
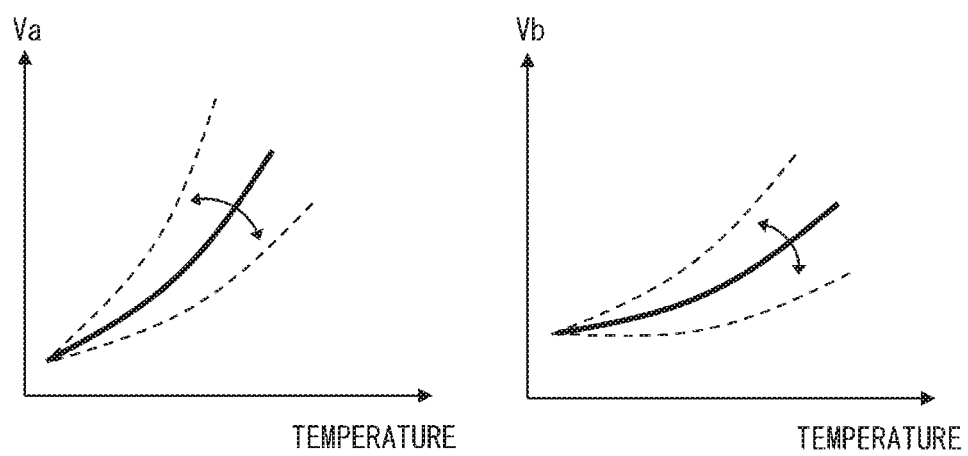
FIG. 3 is a diagram showing temperature characteristics of each of reference voltages Va and Vb generated by the reference voltage generation circuit.

The voltage Vbe between the base and the emitter of the bipolar transistor TR1 has a characteristic that it is reduced in proportion to a temperature increase, that is, a negative primary temperature characteristic. Accordingly, the reference voltage generation circuit 11 is able to freely configure the primary temperature characteristics of the reference voltages Va and Vb as shown in, for example, FIG. 3, by switching connections by the switch elements SW1 and SW2.

Referring back to FIG. 1, the explanation will be continued.

The oscillation circuit 12 includes a frequency/current conversion circuit 121, a control voltage generation circuit 122, a voltage control oscillation circuit 123, and a frequency division circuit 124.

The frequency/current conversion circuit 121 is an RC conversion circuit driven by at least the reference voltage Va, and outputs a current Ie in accordance with the frequency of a feedback signal fCLK. The control voltage generation circuit 122 generates a control voltage Vctrl, which is a direct current, in accordance with a potential difference between a voltage Ve generated based on the current Ie and the reference voltage Vb. The voltage control oscillation circuit 123 generates the oscillation signal CLK having a frequency in accordance with the control voltage Vctrl. For example, the voltage control oscillation circuit 123 generates the oscillation signal CLK having a larger oscillation frequency fo as the control voltage Vctrl becomes larger, and generates the oscillation signal CLK having a smaller oscillation frequency fo as the control voltage Vctrl becomes smaller. The frequency division circuit 124 divides the frequency of the oscillation signal CLK by N (an integer equal to or larger than two) and outputs the resulting signal as the feedback signal fCLK.

(Specific Configuration Example of Oscillation Circuit 12)

Figure 4:
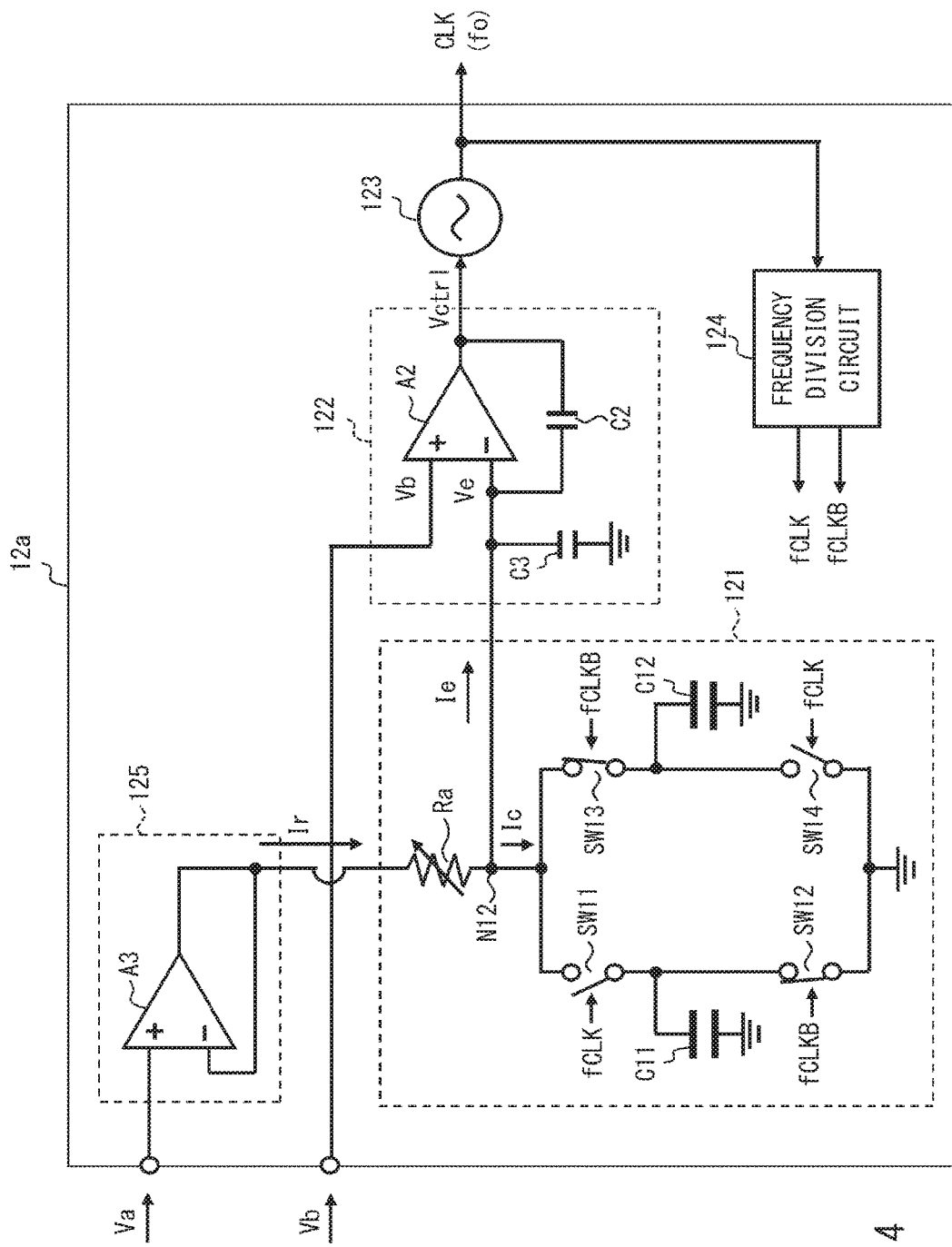
FIG. 4 is a diagram showing a specific configuration example of an oscillation circuit provided in the semiconductor device shown in FIG. 1.

FIG. 4 is a diagram showing a specific configuration example of the oscillation circuit 12 as an oscillation circuit 12a. The example shown in FIG. 4 shows a specific configuration of functional blocks that compose the oscillation circuit 12. In the example shown in FIG. 4, a voltage follower 125 is further provided.

The voltage follower 125 directly outputs the reference voltage Va supplied from the reference voltage generation circuit 11. Specifically, the voltage follower 125 is composed of an operational amplifier A3. The non-inverting input terminal of the operational amplifier A3 is supplied with the reference voltage Va from the reference voltage generation circuit 11, and the inverting input terminal of the operational amplifier A3 is supplied with the output of the operational amplifier A3 in a feedback manner.

The frequency/current conversion circuit 121 includes a resistance element Ra, capacitance elements C11 and C12, and switch elements SW11-SW14.

The resistance element Ra is provided between the output terminal of the voltage follower 125 and the output terminal (node N12) of the frequency/current conversion circuit 121. The resistance element Ra is configured in such a way that the resistance value can be varied.

The switch elements SW11 and SW12 are provided in series between the node N12 and the ground voltage terminal GND. The switch elements SW13 and SW14 are provided in series between the node N12 and the ground voltage terminal GND and are provided in parallel to the switch elements SW11 and SW12. The switch elements SW11 and SW14 are both controlled to be turned on or off by the feedback signal fCLK. The switch elements SW12 and SW13 are both controlled to be turned on or off by an inverting signal fCLKB of the feedback signal fCLK. That is, the switch elements SW11 and SW14 and the switch elements SW12 and SW13 are controlled to be turned on or off complementarily to each other.

The capacitance element C11 is, for example, a Metal Oxide Metal (MOM) capacitance, and is provided between the node between the switch elements SW11 and SW12 and the ground voltage terminal GND. The capacitance element C12 is, for example, a MOM capacitance, and is provided between the node between the switch elements SW13 and SW14 and the ground voltage terminal GND.

When, for example, the switch elements SW11 and SW14 are turned on and the switch elements SW12 and SW13 are turned off, charges of a current Ir that flows through the resistance element Ra are accumulated in the capacitance element C11, and charges accumulated in the capacitance element C12 are released toward the ground voltage terminal GND. On the other hand, when the switch elements SW11 and SW14 are turned off and the switch elements SW12 and SW13 are turned off, the charges of the current Ir that flows through the resistance element Ra are accumulated in the capacitance element C12, and the charges accumulated in the capacitance element C11 are released toward the ground voltage terminal GND.

The control voltage generation circuit 122 includes an operational amplifier A2 and capacitance elements C2 and C3. The non-inverting input terminal of the operational amplifier A2 is supplied with the reference voltage Vb from the reference voltage generation circuit 11, and the output terminal (node N12) of the frequency/current conversion circuit 121 is connected to the inverting input terminal of the operational amplifier A2. Further, the capacitance element C2 is provided between the output terminal of the operational amplifier A2 and the inverting input terminal. The capacitance element C3 is provided between the inverting input terminal of the operational amplifier A2 and the ground voltage terminal GND. That is, in the example shown in FIG. 4, the control voltage generation circuit 122 composes an integrator. In the following description, the control voltage generation circuit 122 is also referred to as an integrator 122.

The capacitance element C3 stores charges of the output current Ie of the frequency/current conversion circuit 121. The operational amplifier A2 outputs the control voltage Vctrl in accordance with the potential difference between the reference voltage Vb and the voltage Ve in accordance with the charges accumulated in the capacitance element C3.

When the operation of the oscillation circuit 12 is stable, even when the current Ie is not output from the frequency/current conversion circuit 121 to the integrator 122, the voltage Ve is kept to the value the same as the reference voltage Vb. In this case, the current Ir that flows through the resistance element Ra is not used as the current Ie, and the whole current Ir flows toward the capacitance elements C11 and C12 as the current Ic. On the other hand, when the operation of the oscillation circuit 12 is not stable, in order to maintain the voltage Ve to be the value the same as the reference voltage Vb, the current Ie is output from the frequency/current conversion circuit 121 to the integrator 122. In this case, a part or all of the current Ir that flows through the resistance element Ra are used as the current Ie, and the remaining current flows toward the capacitance elements C11 and C12 as the current Ic.

Figure 5:
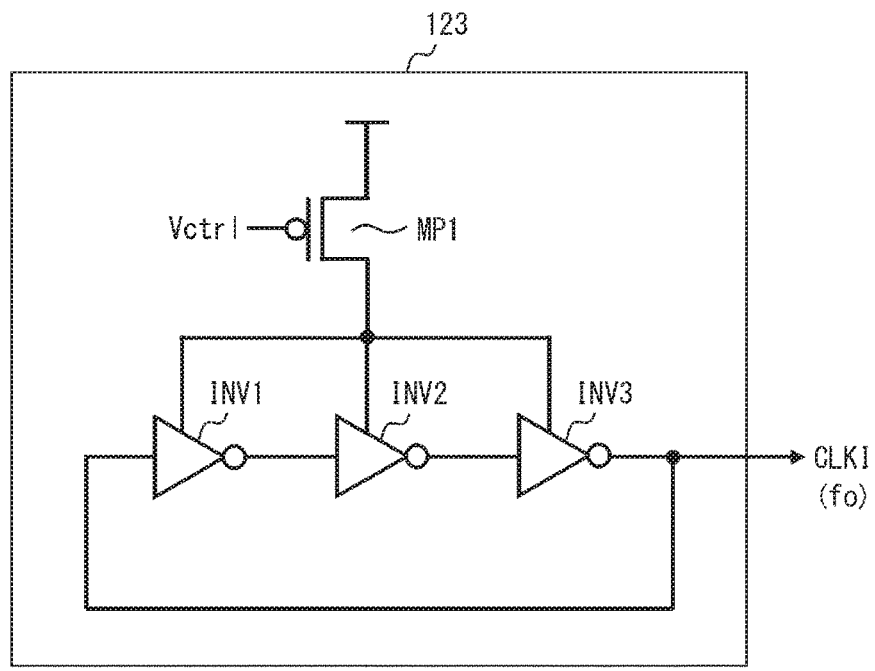
FIG. 5 is a diagram showing a configuration example of a voltage control oscillation circuit provided in the oscillation circuit shown in FIG. 4.

FIG. 5 is a diagram showing one example of specific configurations of the voltage control oscillation circuit 123.

As shown in FIG. 5, the voltage control oscillation circuit 123 includes odd-numbered (in this example, three) inverters INV1-INV3 and a P-channel MOS transistor MP1. The inverters INV1-INV3 are cascade connected in a ring shape. The signal output from the inverter INV3 is used as a signal output from the voltage control oscillation circuit 123 (oscillation signal CLK). The MOS transistor MP1 is provided between the power supply voltage terminal VDD and a high-potential-side power supply terminal of the inverters INV1-INV3, and the control voltage Vctrl is supplied to the gate of the MOS transistor MP1.

By changing the ON resistance of the MOS transistor MP1 in accordance with the level of the control voltage Vctrl, the driving capabilities of the inverters INV1-INV3 can be controlled. Accordingly, the oscillation frequency fo of the output signal (oscillation signal CLK) of the voltage control oscillation circuit 123 is controlled.

Since the other configurations of the oscillation circuit 12a are similar to those of the oscillation circuit 12, descriptions thereof will be omitted.

(Mechanism for Stabilizing Oscillation Signal CLK)

Next, a mechanism for stabilizing the oscillation signal CLK will be explained using calculation expressions.

As described above, when the operation of the oscillation circuit 12 is stable, even when the current Ie does not flow from the frequency/current conversion circuit 121 toward the integrator 122, the voltage Ve is maintained to be the value the same as the reference voltage Vb. In this case, the current Ir that flows through the resistance element Ra is not used as the current Ie and the whole current Ir flows toward the capacitance elements C11 and C12 as the current Ic.

When the capacitance value of each of the capacitance elements C11 and C12 is represented by C (2C in total), Ic=Ve·C·fo/N is established, whereby Ir=2Vb·C·fo/N is derived. Further, since Ir=(Va−Vb)/Ra is established from Ohm's law, (Va−Vb)/Ra=2Vb·C·fo/N is derived. Accordingly, the oscillation frequency fo of the oscillation circuit 12 can be expressed as shown in the following Expression (1).

$$f_o = N \frac{1}{2CR_a} \frac{V_a - V_b}{V_b} \tag{1}$$

As will be understood from Expression (1), while the oscillation frequency fo does not change depending on the fluctuation of the characteristics of the voltage control oscillation circuit 123, it depends on the resistance element Ra and the capacitance elements C11 and C12. Since the temperature characteristics of the capacitance elements C11 and C12 are so small that they can be negligible, it can be said that the oscillation frequency fo substantially depends only on the resistance element Ra. By using the reference voltages Va and Vb by adjusting the primary temperature characteristics thereof in the semiconductor device 1 according to this embodiment, not only the influence on the oscillation frequency fo of the primary temperature characteristic of the resistance element Ra but also the influence on the oscillation frequency fo of the secondary temperature characteristic thereof are suppressed (canceled) The semiconductor device 1 according to this embodiment is therefore able to suppress the temperature dependency of the oscillation frequency fo. The aforementioned point will be explained in further detail.

When the current that flows through one end of the resistance element R1 (the terminal connected to the output terminal of the amplifier A1) N1 is denoted by I1, the current that flows through the other end of the resistance element R1 (the terminal connected to the emitter of the bipolar transistor TR1) N2 is denoted by I2, and the current that flows through the resistance element R2 from a desired node N3 on the resistance element R1 is denoted by I3 in the reference voltage generation circuit 11, I1 32 I2+I is established.

More specifically, the currents I2 and I3 are expressed as shown in the following Expressions (2) and (3).

$$I_2 = \frac{V_b}{mR_2} \tag{2}$$

$$I_3 = \frac{V_{const} - V_{be}}{\gamma R_1} \tag{3}$$

From Expressions (2) and (3), the current I1 can be expressed as shown in the following Expression (4).

$$I_1 = I_3 + I_2 = \frac{V_{const} - V_{be}}{\gamma R_1} + \frac{V_b}{mR_2} \tag{4}$$

When the voltage of the node N3 provided on the resistance element R1 is denoted by Vn3, Vn3=Vbe+I3·θR1 is established, whereby the reference voltage Vb can be expressed as shown in the following Expression (5).

$$V_b = m \cdot Vn3 = m[V_{be} + I_3 \theta R_1] \tag{5}$$

Further, the reference voltage Va can be expressed as shown in the following Expression (6).

$$V_a = \frac{V_b}{m} + I_1(\beta - \theta)R_1 \tag{6}$$

By substituting Expression (3) into Expression (5), the reference voltage Vb can be expressed as shown in the following Expression (7).

$$V_b = V_{const}m\frac{\theta}{\gamma} - V_{be}m\frac{(\theta - \gamma)}{\gamma} \tag{7}$$

Further, by substituting Expression (4) into Expression (6), the reference voltage Va can be expressed as shown in the following Expression (8).

$$V_a = V_{const}\left\{\frac{\theta}{\gamma}\left[1 + \frac{(\beta - \theta)R_1}{R_2}\right] + \frac{(\beta - \theta)}{\gamma}\right\} - V_{be}\left\{\frac{(\theta - \gamma)}{\gamma}\left[1 + \frac{(\beta - \theta)R_1}{R_2}\right] + \frac{(\beta - \theta)}{\gamma}\right\} \tag{8}$$

Next, when the reference voltage Vb is first-order, second-order, and third-order differentiated by the temperature T, the results of the differential operations can be expressed as shown in the following Expressions (9), (10), and (11).

$$\frac{\partial V_b}{\partial T} = -\frac{\partial V_{be}}{\partial T}m\frac{(\theta - \gamma)}{\gamma} \tag{9}$$

$$\frac{\partial^2 V_b}{\partial T^2} = -\frac{\partial^2 V_{be}}{\partial T^2}m\frac{(\theta - \gamma)}{\gamma} \tag{10}$$

$$\frac{\partial^3 V_b}{\partial T^3} = -\frac{\partial^3 V_{be}}{\partial T^3}m\frac{(\theta - \gamma)}{\gamma} \tag{11}$$

Further, when the reference voltage Va is first-order, second-order, and third-order differentiated by the temperature T, the results of the differential operations can be expressed as shown in the following Expressions (12), (13), and (14).

$$\frac{\partial V_a}{\partial T} = -\frac{\partial V_{be}}{\partial T}\left\{\frac{(\theta - \gamma)}{\gamma}\left[1 + \frac{(\beta - \theta)R_1}{R_2}\right] + \frac{(\beta - \theta)}{\gamma}\right\} \tag{12}$$

$$\frac{\partial^2 V_a}{\partial T^2} = -\frac{\partial^2 V_{be}}{\partial T^2}\left\{\frac{(\theta - \gamma)}{\gamma}\left[1 + \frac{(\beta - \theta)R_1}{R_2}\right] + \frac{(\beta - \theta)}{\gamma}\right\} \tag{13}$$

$$\frac{\partial^3 V_a}{\partial T^3} = -\frac{\partial^3 V_{be}}{\partial T^3}\left\{\frac{(\theta - \gamma)}{\gamma}\left[1 + \frac{(\beta - \theta)R_1}{R_2}\right] + \frac{(\beta - \theta)}{\gamma}\right\} \tag{14}$$

Next, by performing Taylor expansion on Expressions (9), (10), and (11), the primary temperature coefficient λb, the secondary temperature coefficient ξb, and the tertiary temperature coefficient ηb of the reference voltage Vb can be expressed as shown in the following Expressions (15), (16), and Expression (17). Note that Vbe0 indicates the reference value of the voltage Vbe (e.g., the voltage value under the room temperature), Vb0 indicates the reference value of the reference voltage Vb (e.g., the voltage value under the room temperature), and λbe, ξbe, and ηbe respectively indicate the primary temperature coefficient, the secondary temperature coefficient, and the tertiary temperature coefficient of the voltage Vbe.

$$\lambda_b = -\frac{V_{be0}}{V_{b0}/m}\lambda_{be}\frac{(\theta - \gamma)}{\gamma} \tag{15}$$

$$\xi_b = -\frac{V_{be0}}{V_{b0}/m}\xi_{be}\frac{(\theta - \gamma)}{\gamma} \tag{16}$$

$$\eta_b = -\frac{V_{be0}}{V_{b0}/m}\eta_{be}\frac{(\theta - \gamma)}{\gamma} \tag{17}$$

Further, by performing Taylor expansion on Expressions (12), (13), and (14), the primary temperature coefficient λa, the secondary temperature coefficient ξa, and the tertiary temperature coefficient ηa of the reference voltage Va can be expressed as shown in the following Expressions (18), (19), and (20). Note that Va0 indicates the reference value of the reference voltage Va (e.g., the voltage value under the room temperature).

$$\lambda_a = -\frac{V_{be0}}{V_{a0}}\lambda_{be}\left\{\frac{(\theta - \gamma)}{\gamma}\left[1 + \frac{(\beta - \theta)R_1}{R_2}\right] + \frac{(\beta - \theta)}{\gamma}\right\} \tag{18}$$

$$\xi_a = -\frac{V_{be0}}{V_{a0}}\xi_{be}\left\{\frac{(\theta - \gamma)}{\gamma}\left[1 + \frac{(\beta - \theta)R_1}{R_2}\right] + \frac{(\beta - \theta)}{\gamma}\right\} \tag{19}$$

$$\eta_a = -\frac{V_{be0}}{V_{a0}}\eta_{be}\left\{\frac{(\theta - \gamma)}{\gamma}\left[1 + \frac{(\beta - \theta)R_1}{R_2}\right] + \frac{(\beta - \theta)}{\gamma}\right\} \tag{20}$$

As will be understood from Expressions (15) and (18), since both the primary temperature coefficients λa and λb of the reference voltages Va and Vb include −λbe, the reference voltages Va and Vb have positive temperature characteristics. Accordingly, the primary temperature coefficients λa and λb of the reference voltages Va and Vb can be freely configured by adjusting the values of β and γ using the switch elements SW1 and SW2.

Next, by using Expressions (15), (16), and (17), the relation among the primary temperature coefficient λb, the secondary temperature coefficient ξb, and the tertiary temperature coefficient ηb of the reference voltage Vb can be expressed as shown in the following Expressions (21) and (22).

$$\xi_b = \lambda_b(\xi_{be}/\lambda_{be}) \tag{21}$$

$$\eta_b = \lambda_b(\eta_{be}/\lambda_{be}) \tag{22}$$

Further, by using Expressions (18), (19), and (20), the relation among the primary temperature coefficient λa, the secondary temperature coefficient ξa, and the tertiary temperature coefficient ηa of the reference voltage Va can be expressed as shown in the following Expressions (23) and (24).

$$\xi_a = \lambda_a(\xi_{be}/\lambda_{be}) \tag{23}$$

$$\eta_a = \lambda_a(\eta_{be}/\lambda_{be}) \tag{24}$$

As will be understood from Expressions (21)-(24), the secondary temperature coefficient ξa and the tertiary temperature coefficient ηa of the reference voltage Va are directly proportional to the primary temperature coefficient λa, and the secondary temperature coefficient ξb and the tertiary temperature coefficient ηb of the reference voltage Vb are directly proportional to the primary temperature coefficient λb.

The oscillation frequency fo can be expressed as shown in the following Expression (25). In Expression (25), among the temperature coefficients of the oscillation frequency fo, the primary temperature coefficient λf, the secondary temperature coefficient ξf, and the tertiary temperature coefficient ηf are taken into consideration. Further, fo0 indicates the reference value of the oscillation frequency fo (e.g., the frequency under the room temperature).

$$fo = fo0(1 + \lambda_f \Delta T + \xi_f \Delta T^2 + \eta_f \Delta T^3) \quad (25)$$

In a similar way, the oscillation frequency fo in Expression (1) can be expressed as shown in the following Expression (26). Note that Ra0 indicates the reference value of the resistance element Ra (e.g., the resistance value under the room temperature), and $\lambda_R$, $\xi_R$, and $\eta_R$ respectively indicate the primary temperature coefficient, the secondary temperature coefficient, and the tertiary temperature coefficient of the resistance element Ra.

$$f_o = \frac{N}{2C} \frac{V_{a0}(1 + \lambda_a \Delta T + \xi_a \Delta T^2 + \eta_a \Delta T^3) - V_{b0}(1 + \lambda_b \Delta T + \xi_b \Delta T^2 + \eta_b \Delta T^3)}{R_{a0}\left(\begin{array}{c}1 + \lambda_R \Delta T + \\ \xi_R \Delta T^2 + \eta_R \Delta T^3\end{array}\right) V_{b0}\left(\begin{array}{c}1 + \lambda_b \Delta T + \\ \xi_b \Delta T^2 + \eta_b \Delta T^3\end{array}\right)} \quad (26)$$

From Expressions (25) and (26), the following Expression (27) is established.

$$\frac{N}{2C} \frac{V_{a0}(1 + \lambda_a \Delta T + \xi_a \Delta T^2 + \eta_a \Delta T^3) - V_{b0}(1 + \lambda_b \Delta T + \xi_b \Delta T^2 + \eta_b \Delta T^3)}{R_{a0}\left(\begin{array}{c}1 + \lambda_R \Delta T + \\ \xi_R \Delta T^2 + \eta_R \Delta T^3\end{array}\right) V_{b0}\left(\begin{array}{c}1 + \lambda_b \Delta T + \\ \xi_b \Delta T^2 + \eta_b \Delta T^3\end{array}\right)} = f_{o0}(1 + \lambda_f \Delta T + \xi_f \Delta T^2 + \eta_f \Delta T^3) \quad (27)$$

Expansion of the left side of Expression (27) yields the following Expression (28).

$$\frac{N}{2C} \frac{V_{a0} + V_{a0}\lambda_a \Delta T + V_{a0}\xi_a \Delta T^2 + V_{a0}\eta_a \Delta T^3 - V_{b0} - V_{b0}\lambda_b \Delta T - V_{b0}\xi_b \Delta T^2 - V_{b0}\eta_b \Delta T^3}{(R_{a0} + R_{a0}\lambda_R \Delta T + R_{a0}\xi_R \Delta T^2 + R_{a0}\eta_R \Delta T^3)(V_{b0} + V_{b0}\lambda_b \Delta T + V_{b0}\xi_b \Delta T^2 + V_{b0}\eta_b \Delta T^3)} = f_{o0}(1 + \lambda_f \Delta T + \xi_f \Delta T^2 + \eta_f \Delta T^3) \quad (28)$$

Further, Expression (28) can be expressed as shown in the following Expression (29).

$$\frac{N}{2CR_{a0}} \frac{V_{a0} - V_{b0}}{V_{b0}} \times \frac{1 + \frac{V_{a0}\lambda_a - V_{b0}\lambda_b}{V_{a0} - V_{b0}}\Delta T + \frac{V_{a0}\xi_a - V_{b0}\xi_b}{V_{a0} - V_{b0}}\Delta T^2 + \frac{V_{a0}\eta_a - V_{b0}\eta_b}{V_{a0} - V_{b0}}\Delta T^3}{1 + (\lambda_b + \lambda_R)\Delta T + (\xi_b + \xi_R + \lambda_R\lambda_b)\Delta T^2 + (\eta_b + \eta_R + \lambda_R\xi_b + \xi_R\lambda_b)\Delta T^3} = f_{o0}(1 + \lambda_f \Delta T + \xi_f \Delta T^2 + \eta_f \Delta T^3) \quad (29)$$

From Expressions (1) and (29), the following Expression (30) can be derived.

$$\frac{1 + \frac{V_{a0}\lambda_a - V_{b0}\lambda_b}{V_{a0} - V_{b0}}\Delta T + \frac{V_{a0}\xi_a - V_{b0}\xi_b}{V_{a0} - V_{b0}}\Delta T^2 + \frac{V_{a0}\eta_a - V_{b0}\eta_b}{V_{a0} - V_{b0}}\Delta T^3}{1 + (\lambda_b + \lambda_R)\Delta T + (\xi_b + \xi_R + \lambda_R\lambda_b)\Delta T^2 + (\eta_b + \eta_R + \lambda_R\xi_b + \xi_R\lambda_b)\Delta T^3} = 1 + \lambda_f \Delta T + \xi_f \Delta T^2 + \eta_f \Delta T^3 \quad (30)$$

From Expression (30), the following Expression (31) is established.

$$1 + \frac{V_{a0}\lambda_a - V_{b0}\lambda_b}{V_{a0} - V_{b0}}\Delta T + \frac{V_{a0}\xi_a - V_{b0}\xi_b}{V_{a0} - V_{b0}}\Delta T^2 + \frac{V_{a0}\eta_a - V_{b0}\eta_b}{V_{a0} - V_{b0}}\Delta T^3 = \quad (31)$$
$$(1 + \lambda_f \Delta T + \xi_f \Delta T^2 + \eta_f \Delta T^3) \times (1 + (\lambda_b + \lambda_R)\Delta T +$$
$$(\xi_b + \xi_R + \lambda_R\lambda_b)\Delta T^2 + (\eta_b + \eta_R + \lambda_R\xi_b + \xi_R\lambda_b)\Delta T^3)$$

From Expression (31), the following Expression (32) is established.

$$1 + \frac{V_{a0}\lambda_a - V_{b0}\lambda_b}{V_{a0} - V_{b0}}\Delta T + \frac{V_{a0}\xi_a - V_{b0}\xi_b}{V_{a0} - V_{b0}}\Delta T^2 + \frac{V_{a0}\eta_a - V_{b0}\eta_b}{V_{a0} - V_{b0}}\Delta T^3 = \quad (32)$$
$$1 + (\lambda_b + \lambda_R + \lambda_f)\Delta T + (\xi_b + \xi_R + \lambda_R\lambda_b + \lambda_f(\lambda_b + \lambda_R) + \xi_f)\Delta T^2 +$$
$$(\eta_b + \eta_R + \lambda_R\xi_b + \xi_R\lambda_b + \lambda_f(\xi_b + \xi_R + \lambda_R\lambda_b) + \xi_f(\lambda_b + \lambda_R) + \eta_f)$$
$$\Delta T^3$$

From Expression (32), the following Expressions (33), (34), and (35) can be derived.

$$\frac{V_{a0}\lambda_a - V_{b0}\lambda_b}{V_{a0} - V_{b0}} = \lambda_b + \lambda_R + \lambda_f \quad (33)$$

$$\frac{V_{a0}\xi_a - V_{b0}\xi_b}{V_{a0} - V_{b0}} = \xi_b + \xi_R + \lambda_R\lambda_b + \lambda_f(\lambda_b + \lambda_E) + \xi_f \quad (34)$$

$$\frac{V_{a0}\eta_a - V_{b0}\eta_b}{V_{a0} - V_{b0}} = \quad (35)$$
$$\eta_b + \eta_R + \lambda_R\xi_b + \xi_R\lambda_b + \lambda_f(\xi_b + \xi_R + \lambda_R\lambda_b) + \xi_f(\lambda_b + \lambda_R) + \eta_f$$

From Expression (33), the primary temperature coefficient λf of the oscillation frequency fo can be expressed as shown in the following Expression (36).

$$\lambda_f = \frac{V_{a0}}{V_{a0} - V_{b0}}(\lambda_a - \lambda_b) - \lambda_R \quad (36)$$

If the primary temperature coefficient λf of the oscillation frequency fo has been corrected to 0, the following Expression (37) is established from Expression (36).

$$\lambda_a - \lambda_b = \lambda_R \frac{V_{a0} - V_{b0}}{V_{a0}} \quad (37)$$

In this case, from Expression (34), the secondary temperature coefficient ξf of the oscillation frequency fo can be expressed as shown in the following Expression (38).

$$\xi_f = \frac{V_{a0}}{V_{a0} - V_{b0}}(\xi_a - \xi_b) - \xi_R - \lambda_R \lambda_b \quad (38)$$

If not only the primary temperature coefficient λf of the oscillation frequency fo but also the secondary temperature coefficient ξf of the oscillation frequency fo have been corrected to 0, the following Expression (39) is established from Expression (38).

$$\lambda_b = \frac{1}{\lambda_R}\left[\frac{V_{a0}}{V_{a0} - V_{b0}}(\xi_a - \xi_b) - \xi_R\right] \quad (39)$$

From the above expressions, the primary temperature coefficient λb of the reference voltage Vb can be expressed as shown in the following Expression (40), and the primary temperature coefficient λa of the reference voltage Va can be expressed as shown in the following Expression (41).

$$\lambda_b = \frac{\xi_{be}}{\lambda_{be}} - \frac{\xi_R}{\lambda_R} \quad (40)$$

$$\lambda_a = \lambda_R \frac{V_{a0} - V_{b0}}{V_{a0}} + \frac{\xi_{be}}{\lambda_{be}} - \frac{\xi_R}{\lambda_R} \quad (41)$$

That is, by adjusting the values of β and γ using the switch elements SW1 and SW2, the primary temperature coefficients λa and λb of the reference voltages Va and Vb are set to such values that Expressions (41) and (40) are satisfied, whereby it is possible to suppress both the primary temperature coefficient λf and the secondary temperature coefficient ξf of the oscillation frequency fo (ideally they can be substantially corrected to 0).

When λf=0 and ξf=0, from Expression (35), the tertiary temperature coefficient ηf of the oscillation frequency fo can be expressed as shown in the following Expression (42).

$$\eta_f = \frac{V_{a0}(\eta_a - \eta_b)}{V_{a0} - V_{b0}} - \eta_R - (\lambda_R \xi_b + \xi_R \lambda_b) \quad (42)$$

By substituting Expressions (21), (22), (24), and (37) into Expression (42), the tertiary temperature coefficient ηf of the oscillation frequency fo can be expressed as shown in the following Expression (43).

$$\eta_f = \lambda_R \left[\frac{\eta_{be}}{\lambda_{be}} - \left(\frac{\xi_{be}}{\lambda_{be}}\right)^2\right] + \frac{\xi_R^2}{\lambda_R} - \eta_R \quad (43)$$

In this embodiment, the tertiary temperature coefficient ηf of the oscillation frequency fo is an error component. However, as will be understood from Expression (43), when the resistance element Ra is composed of a TiN resistance or the like that has a small primary temperature coefficient $\lambda_R$, the error due to the tertiary temperature coefficient ηf of the oscillation frequency fo is suppressed. Further, when the current flowing through the bipolar transistor TR1 is reduced and at the same time the size of the bipolar transistor TR1 is increased, the primary temperature coefficient λbe of the voltage Vbe increases, whereby the error due to the tertiary temperature coefficient ηf of the oscillation frequency fo is suppressed.

Figure 6:
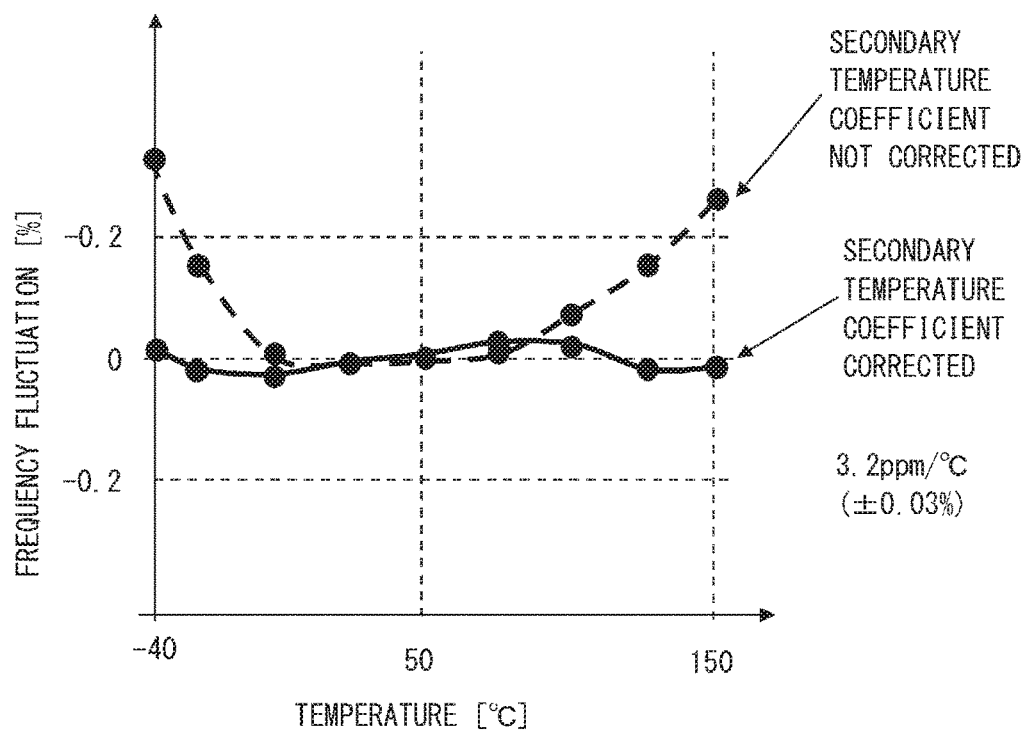
FIG. 6 is a diagram showing temperature dependencies of oscillation frequencies before and after a secondary temperature coefficient is corrected.

FIG. 6 is a diagram showing temperature dependencies of the oscillation frequencies before and after the secondary temperature coefficient is corrected. Referring to FIG. 6, before the secondary temperature coefficient is corrected (that is, only the primary temperature coefficient has been corrected), the oscillation frequency fo fluctuates by more than −0.2% under a low temperature and a high temperature. On the other hand, after the secondary temperature coefficient has been corrected, the fluctuation amount of the oscillation frequency fo with respect to the temperature change is suppressed to be equal to or smaller than ±0.03%.

As described above, the semiconductor device 1 according to this embodiment is able to suppress (cancel) not only the influence on the oscillation frequency fo of the primary temperature characteristic of the resistance element Ra but also the influence on the oscillation frequency fo of the secondary temperature characteristic by using the reference voltages Va and Vb by adjusting the primary temperature characteristics thereof. Accordingly, the semiconductor device 1 according to this embodiment is able to output the oscillation signal having a stable oscillation frequency regardless of the temperature.

When the functions similar to those of the semiconductor device 1 are achieved using the reference voltage generation circuit disclosed in Published Japanese Translation of PCT International Publication for Patent Application, No. 2006-519433, the reference voltages Va and Vb need to be generated using the two reference voltage generation circuits, which causes the size of the circuit to be increased.

While the case in which the reference voltage generation circuit 11 has the configuration shown in FIG. 2 has been described as an example in this embodiment, this configuration is merely an example. It is sufficient that the reference voltage generation circuit 11 have such a configuration that it generates the reference voltages Va and Vb capable of adjusting the primary temperature characteristic. Hereinafter, a modified example of the reference voltage generation circuit 11 will be explained in brief with reference to FIG. 7.

(Modified Example of Reference Voltage Generation Circuit 11)

Figure 7:
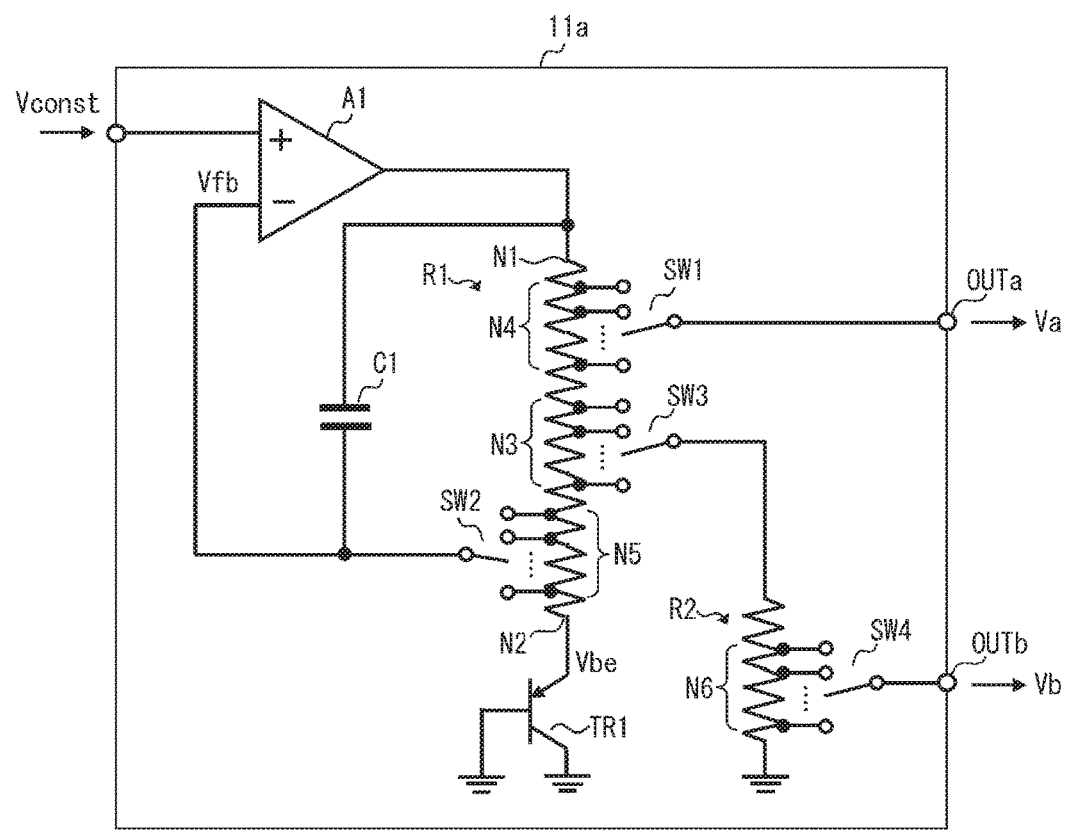
FIG. 7 is a diagram showing a modified example of the oscillation circuit provided in the semiconductor device shown in FIG. 1.

FIG. 7 is a diagram showing a modified example of the reference voltage generation circuit 11 as a reference voltage generation circuit 11a. The reference voltage generation circuit 11a is different from the reference voltage generation circuit 11 in that it further includes switch elements SW3 and SW4.

The switch element SW3 selects one of a plurality of nodes N3 provided on the resistance element R1, and connects the selected one to one end of the resistance element R2. The switch element SW4 selects one of a plurality of nodes N6 provided on the resistance element R2 and connects the selected one to the external output terminal OUTb. The voltage of the node N6 selected by the switch element SW4 is output to the outside of the reference voltage generation circuit 11a via the external output terminal OUTb as the reference voltage Vb.

Since the other configurations of the reference voltage generation circuit 11a are similar to those of the reference voltage generation circuit 11, descriptions thereof will be omitted.

The reference voltage generation circuit 11a is able to obtain the effects similar to those of the reference voltage generation circuit 11. In particular, the reference voltage generation circuit 11a is able to set the primary temperature characteristic of the reference voltages Va and Vb more finely by using the switch elements SW3 and SW4.

(Layout Configuration Example of Semiconductor Device 1)

Figure 8:
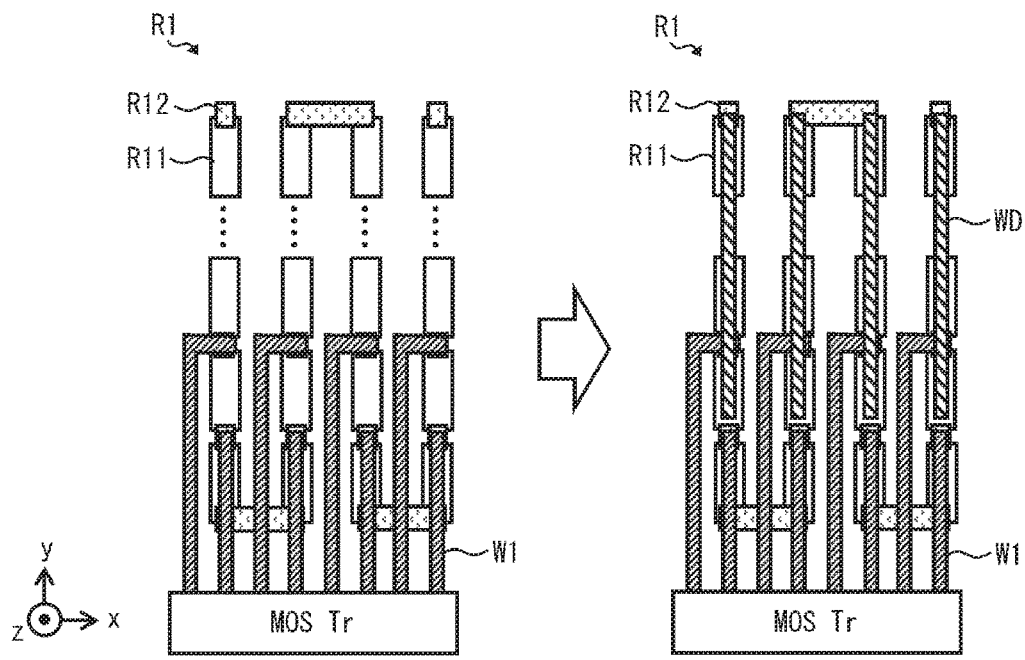
FIG. 8 is a diagram showing one example of a layout configuration of the semiconductor device shown in FIG. 1.

FIG. 8 is a diagram showing a layout configuration example of a part of the semiconductor device 1.

As shown in FIG. 8, the resistance element R1 is arranged in an M1 layer, which is a low-order layer. The resistance element R1 is composed of a plurality of rectangular unit resistances R11 and a plurality of coupling units R12 that couple the unit resistances R11.

A wire W1, which connects the components of the semiconductor device 1, is arranged in an M2 layer, which is a layer laminated on the M1 layer (in this example, an upper layer). In the example shown in FIG. 8, the wire W1 is arranged to cover a part of the resistance element R1 when the wire W1 is seen in the plane view. Since the part of the resistance element R1 covered with the wire W1 is compressed by the wire W1, this part may have a resistance value that is different from the resistance value of the part of the resistance element R1 that is not covered with the wire W1. In this case, it is possible that the differential non-linear error (DNL: Differential Non-Linearity) of the resolution of the reference voltages Va and Vb be degraded.

In order to solve the aforementioned problem, in this embodiment, a dummy wire WD is arranged in the M2 layer in such a way that it covers the part of the resistance element R1 that is not covered with the wire W1 when the dummy wire WD is seen in the plane view. Accordingly, since all the resistance elements R1 have the same resistance value, it is possible to prevent the differential non-linear error of the resolution of the reference voltages Va and Vb from being degraded.

(Another Layout Configuration Example of Semiconductor Device 1)

Figure 9:
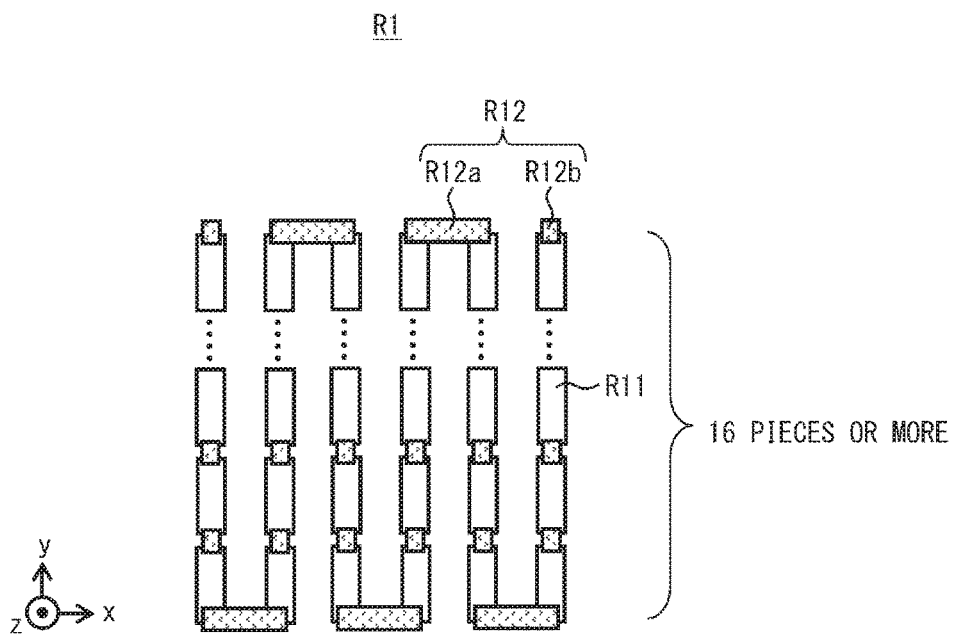
FIG. 9 is a diagram showing one example of the layout configuration of the semiconductor device shown in FIG. 1.

FIG. 9 is a diagram showing another layout configuration example of a part of the semiconductor device 1.

The resistance element R1 composed of a plurality of unit resistances R11 and a plurality of coupling units R12 that couple the unit resistances R11 is arranged in such a way that it is extended along the x-axis direction while repeating reciprocation along the y-axis direction.

Among the plurality of coupling units R12, a coupling unit R12a that is provided at a turning point of the reciprocation repeated along the y-axis direction is longer than the other coupling units R12b. Therefore, the coupling unit R12a has a parasitic resistance larger than that of the coupling unit R12b. Accordingly, it is possible that the differential non-linear error of the resolution of the reference voltages Va and Vb may be degraded.

In this embodiment, the number of unit resistances R11 arranged between the turning points arranged along the y-axis direction is limited to, for example, 16 or larger. Accordingly, the proportion of the coupling units R12a with respect to the plurality of coupling units R12 can be reduced and the influence of the parasitic capacitance of the coupling units R12a can be reduced, whereby it is possible to prevent the differential non-linear error of the resolution of the reference voltages Va and Vb from being degraded.

<Second Embodiment>

Figure 10:
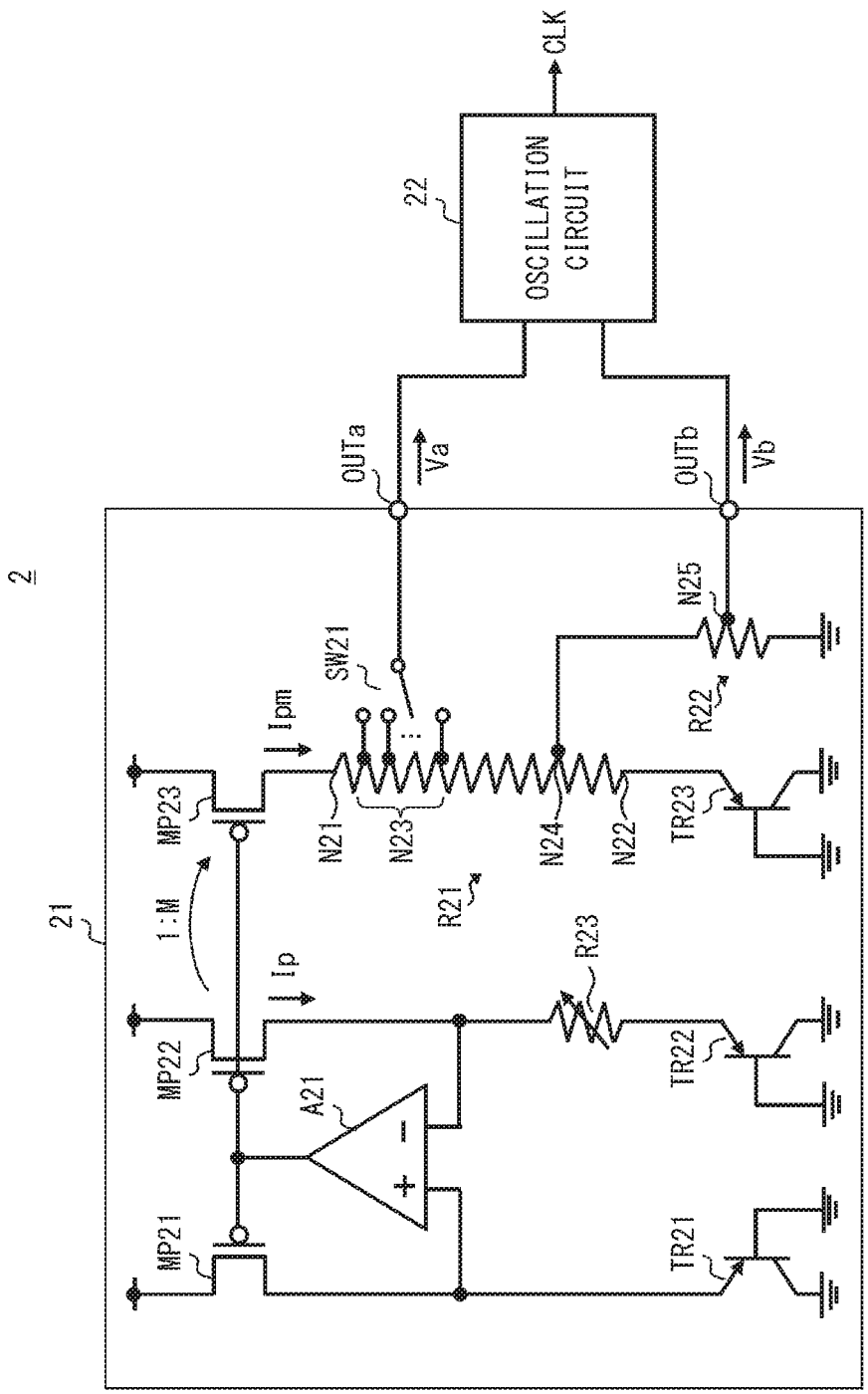
FIG. 10 is a diagram showing a configuration example of a semiconductor device according to a second embodiment.

FIG. 10 is a diagram showing a configuration example of a semiconductor device 2 according to a second embodiment.

As shown in FIG. 10, the semiconductor device 2 includes a reference voltage generation circuit 21 and an oscillation circuit 22. The reference voltage generation circuit 21 corresponds to the reference voltage generation circuit 11 and the oscillation circuit 22 corresponds to the oscillation circuit 12. In the example shown in FIG. 10, a specific configuration example of the reference voltage generation circuit 21 is shown.

The reference voltage generation circuit 21 includes an operational amplifier A21, MOS transistors MP21-MP23, bipolar transistors TR21-TR23, a resistance element R21, a resistance element R22, a variable resistance R23, and a switch element SW21. In this embodiment, an example in which all of the MOS transistors MP21-MP23 are P-channel MOS transistors and all of the bipolar transistors TR21-TR23 are PNP bipolar transistors will be explained.

The MOS transistor MP21 has a source connected to the power supply voltage terminal VDD, a drain connected to the emitter of the bipolar transistor TR21, and a gate connected to the output terminal of the operational amplifier A21. Both the base and the collector of the bipolar transistor TR21 are connected to the ground voltage terminal GND.

The MOS transistor MP22 has a source connected to the power supply voltage terminal VDD, a drain electrically connected to the emitter of the bipolar transistor TR22 via the variable resistance R23, and a gate connected to the output terminal of the operational amplifier A21. Both the base and the collector of the bipolar transistor TR22 are connected to the ground voltage terminal GND.

The operational amplifier A21 generates a voltage in accordance with the potential difference between the drain voltage of the MOS transistor MP21 and the drain voltage of the MOS transistor MP22, and outputs the generated voltage to the gates of the MOS transistors MP21-MP23.

The MOS transistor MP23 has a source connected to the power supply voltage terminal VDD, a drain connected to one end (node N21) of the resistance element R21, and a gate connected to the output terminal of the operational amplifier A21.

The other end (node N22) of the resistance element R21 is connected to the emitter of the bipolar transistor TR23. Both the base and the collector of the bipolar transistor TR23 are connected to the ground voltage terminal GND.

The switch element SW21 selects one of a plurality of nodes N23 provided on the resistance element R21 and connects the selected node to the external output terminal OUTa. The voltage of the node N23 selected by the switch element SW21 is output to the outside of the reference voltage generation circuit 21 via the external output terminal OUTa as the reference voltage Va.

The resistance element R22 is provided between a node N24 on the resistance element R21 and the ground voltage terminal GND. Further, a node N25 provided on the resistance element R22 and the external output terminal OUTb are connected to each other. The voltage of the node N25 on the resistance element R22 is output to the outside of the reference voltage generation circuit 21 via the external output terminal OUTb as the reference voltage Vb.

The reference voltage generation circuit 21 is able to adjust the current value of a current Ip that flows between the source and the drain of the MOS transistor MP22 by adjusting the resistance value of the variable resistance R23. In accordance therewith, the current value of a current Ipm that flows between the source and the drain of the MOS transistor MP23 can be adjusted. In other words, the reference voltage generation circuit 21 is able to adjust the current value of the current Ipm that flows through the resistance element R21 by adjusting the resistance value of the variable resistance R23.

In this example, the size of the MOS transistor MP23 is M times as large as that of the MOS transistor MP22. Therefore, the current Ipm, which is M times as large as the current Ip of the MOS transistor MP22 that flows between the source and the drain, flows between the source and the drain of the MOS transistor MP23 (in other words, the resistance element R21).

The voltage between the base and the emitter in each of the bipolar transistors TR21-TR23 has a characteristic that it is reduced in proportion to a temperature increase, that is, a negative primary temperature characteristic. Accordingly, the reference voltage generation circuit 21 is able to freely configure the primary temperature characteristics of the reference voltages Va and Vb by adjusting the resistance value of the variable resistance R23 and switching connections by the switch element SW21.

The oscillation circuit 22 outputs the oscillation signal CLK having a stable oscillation frequency fo with less fluctuation due to a temperature change by using the reference voltages Va and Vb. Since the specific configuration of the oscillation circuit 22 is similar to that of the oscillation circuit 12, descriptions thereof will be omitted.

As described above, the semiconductor device 2 according to this embodiment is able to provide effects similar to those of the semiconductor device 1. Since the semiconductor device 2 according to this embodiment does not include the resistance element between the output terminal and the inverting input terminal of the operational amplifier A21 unlike the case in the semiconductor device 1, it is possible to easily guarantee a sufficient phase margin of the operational amplifier A21.

While the case in which the reference voltage generation circuit 21 has the configuration shown in FIG. 10 has been described in this embodiment, this configuration is merely an example. It is sufficient that the reference voltage generation circuit 21 have such a configuration that it generates the reference voltages Va and Vb capable of adjusting the primary temperature characteristic. In the following description, a modified example of the reference voltage generation circuit 21 will be explained in brief with reference to FIG. 11.

(Modified Example of Reference Voltage Generation Circuit 21)

Figure 11:
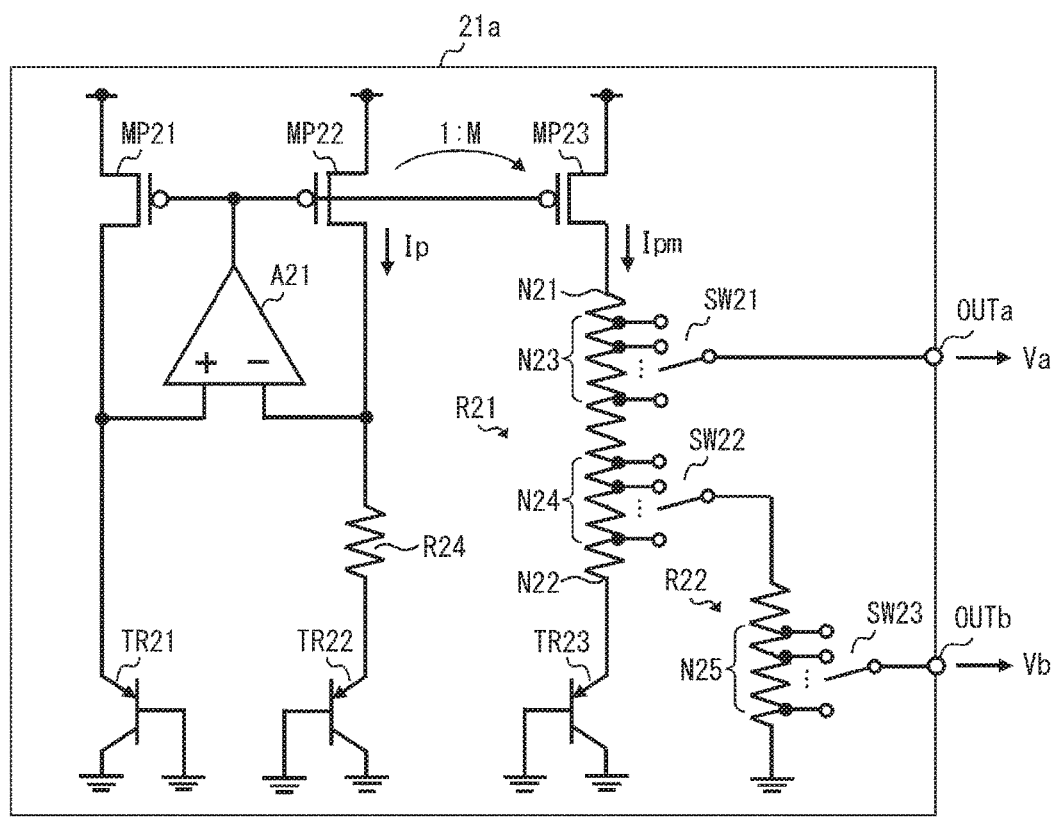
FIG. 11 is a diagram showing a modified example of a reference voltage generation circuit shown in FIG. 10.

FIG. 11 is a diagram showing a modified example of the reference voltage generation circuit 21 as a reference voltage generation circuit 21a. The reference voltage generation circuit 21a is different from the reference voltage generation circuit 21 in that it includes a resistance element R24 in place of the variable resistance R23 and it further includes switch elements SW22 and SW23.

The switch element SW22 selects one of a plurality of nodes N24 provided on the resistance element R21 and connects the selected one to one end of the resistance element R22. The switch element SW23 selects one of a plurality of nodes N25 provided on the resistance element R22 and connects the selected one to the external output terminal OUTb. The voltage of the node N25 selected by the switch element SW23 is output to the outside of the reference voltage generation circuit 21a via the external output terminal OUTb as the reference voltage Vb.

Since the other configurations of the reference voltage generation circuit 21a are similar to those of the reference voltage generation circuit 21, descriptions thereof will be omitted.

The reference voltage generation circuit 21a is able to freely configure the primary temperature characteristics of the reference voltages Va and Vb by switching connections by the switch elements SW21-SW23.

<Third Embodiment>

Figure 12:
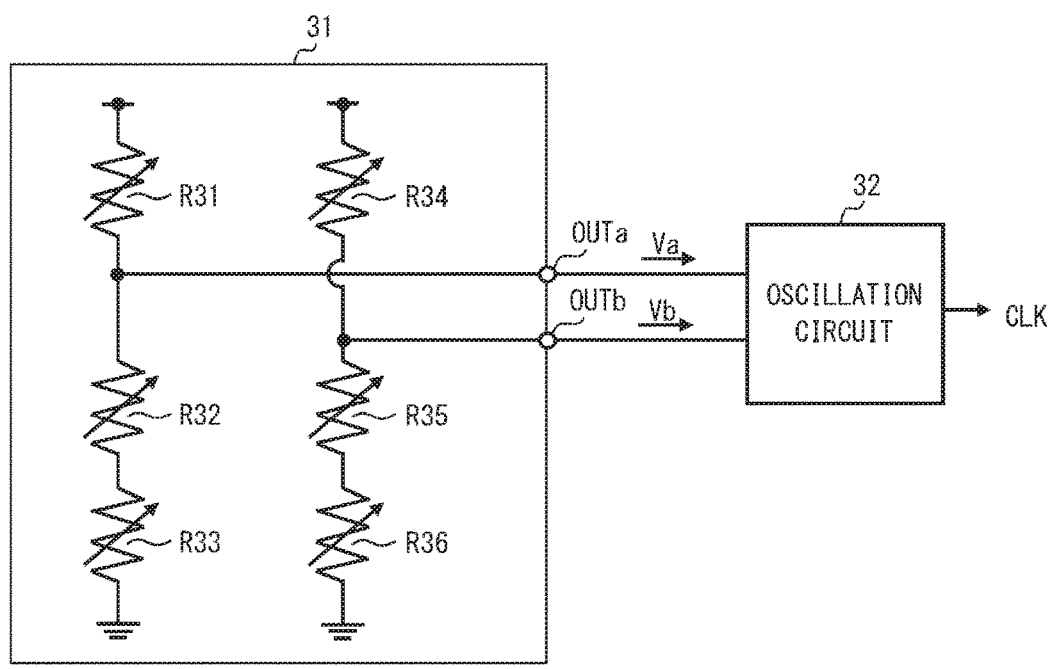
FIG. 12 is a diagram showing a configuration example of a semiconductor device according to a third embodiment.

FIG. 12 is a diagram showing a configuration example of a semiconductor device 3 according to a third embodiment.

As shown in FIG. 12, the semiconductor device 3 includes a reference voltage generation circuit 31 and an oscillation circuit 32. The reference voltage generation circuit 31 corresponds to the reference voltage generation circuit 11 and the oscillation circuit 32 corresponds to the oscillation circuit 12. In the example shown in FIG. 12, a specific configuration example of the reference voltage generation circuit 31 is shown.

The reference voltage generation circuit 31 includes variable resistances R31-R36. The variable resistances R31-R33 are provided in series between the power supply voltage terminal VDD and the ground voltage terminal GND. The variable resistances R34-R36 are provided in series between the power supply voltage terminal VDD and the ground voltage terminal GND independently from the variable resistances R31-R33. The voltage of the node between the variable resistances R31 and R32 is output to the outside of the reference voltage generation circuit 31 via the external output terminal OUTa as the reference voltage Va. The voltage of the node between the variable resistances R34 and R35 is output to the outside of the reference voltage generation circuit 31 via the external output terminal OUTb as the reference voltage Vb.

The variable resistances R31, R33, R34, and R36 and the variable resistances R32 and R35 have temperature characteristics different from each other. Therefore, the primary temperature characteristics of the reference voltages Va and Vb can be freely configured by adjusting the resistance values of the variable resistances R31-R36.

Specifically, the reference voltages Va and Vb can be respectively expressed by the following Expressions (44) and (45). Note that R31_0-R36_0 indicate the reference values of the variable resistances R31-R36 (e.g., the resistance values under the room temperature), $\lambda_p$ indicates the primary temperature coefficient of the variable resistances R31, R33, R34, and R36, and $\lambda_q$ indicates the primary temperature coefficient of the variable resistances R32 and R35.

$$V_a = VDD \frac{R_{32} + R_{33}}{R_{31} + R_{32} + R_{33}} \qquad (44)$$

$$= VDD \frac{R_{32\_0}(1 + \lambda_q \Delta T) + R_{33\_0}(1 + \lambda_p \Delta T)}{(R_{31\_0} + R_{33\_0})(1 + \lambda_p \Delta T) + R_{32\_0}(1 + \lambda_q \Delta T)}$$

$$= VDD \frac{R_{32\_0} + R_{33\_0}}{R_{31\_0} + R_{32\_0} + R_{33\_0}} \times$$

$$\left[1 + \frac{R_{31\_0} R_{32\_0}(\lambda_q - \lambda_p)}{(R_{32\_0} + R_{33\_0})(R_{31\_0} + R_{32\_0} + R_{33\_0})} \Delta T\right]$$

-continued $$V_b = VDD \frac{R_{35} + R_{36}}{R_{34} + R_{35} + R_{36}} \quad (45)$$

$$= VDD \frac{R_{35\_0}(1 + \lambda_q \Delta T) + R_{36\_0}(1 + \lambda_p \Delta T)}{(R_{34\_0} + R_{36\_0})(1 + \lambda_p \Delta T) + R_{35\_0}(1 + \lambda_q \Delta T)}$$

$$= VDD \frac{R_{35\_0} + R_{36\_0}}{R_{34\_0} + R_{35\_0} + R_{36\_0}} \times$$

$$\left[1 + \frac{R_{34\_0} R_{35\_0}(\lambda_q - \lambda_p)}{(R_{35\_0} + R_{36\_0})(R_{34\_0} + R_{35\_0} + R_{36\_0})} \Delta T\right]$$

As will be understood from Expression (44), it is possible to adjust the primary temperature coefficient of the reference voltage Va by adjusting the resistance values of the variable resistances R31, R32, and R33. Further, as will be understood from Expression (45), it is possible to adjust the primary temperature coefficient of the reference voltage Vb by adjusting the resistance values of the variable resistances R34, R35, and R36.

The oscillation circuit 32 is able to output the oscillation signal CLK having a stable oscillation frequency fo with less fluctuation due to a temperature change by using the reference voltages Va and Vb. Since the specific configuration of the oscillation circuit 32 is similar to that of the oscillation circuit 12, descriptions thereof will be omitted.

As described above, the semiconductor device 3 according to this embodiment is able to obtain the effects similar to those of the semiconductor device 1. Further, the semiconductor device 3 according to this embodiment is able to provide the reference voltage generation circuit with a simple circuit configuration.

While the case in which the reference voltage generation circuit 31 has a configuration shown in FIG. 12 has been described in this embodiment, this configuration is merely an example. It is sufficient that the reference voltage generation circuit 31 have such a configuration that it generates the reference voltages Va and Vb capable of adjusting the primary temperature characteristic.

<Fourth Embodiment>

Figure 13:
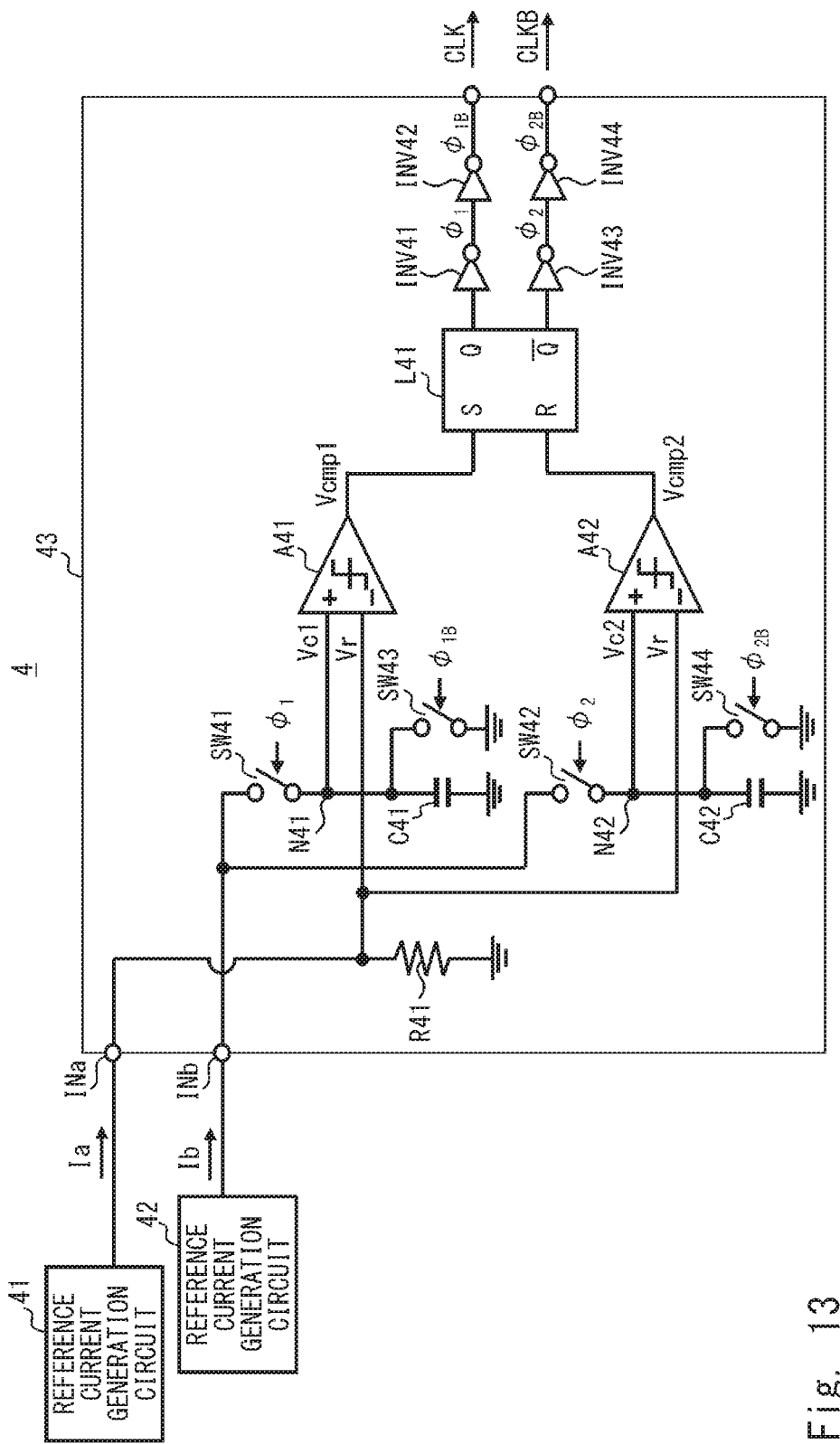
FIG. 13 is a diagram showing a configuration example of a semiconductor device according to a fourth embodiment.

FIG. 13 is a diagram showing a configuration example of a semiconductor device 4 according to a fourth embodiment.

As shown in FIG. 13, the semiconductor device 4 includes reference current generation circuits 41 and 42 and an oscillation circuit 43.

The reference current generation circuit 41 generates a reference current Ia capable of adjusting the temperature characteristics. The reference current generation circuit 42 generates a reference current Ib capable of adjusting the temperature characteristics. The oscillation circuit 43 outputs the oscillation signal CLK having the oscillation frequency fo by using the reference currents Ia and Ib.

(Specific Configuration Example of Reference Current Generation Circuit 41)

Figure 14:
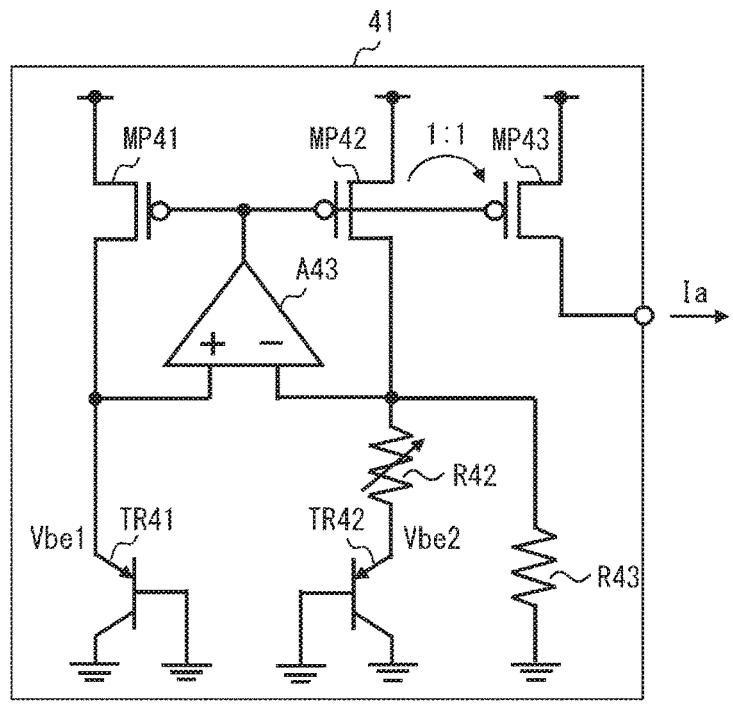
FIG. 14 is a diagram showing a specific configuration example of a first reference current generation circuit provided in the semiconductor device shown in FIG. 13.

FIG. 14 is a specific configuration example of the reference current generation circuit 41.

As shown in FIG. 14, the reference current generation circuit 41 includes an operational amplifier A43, MOS transistors MP41-MP43, bipolar transistors TR41 and TR42, a variable resistance R42, and a resistance element R43. In this embodiment, an example in which all of the MOS transistors MP41-MP43 are P-channel MOS transistors and both the bipolar transistors TR41 and TR42 are PNP bipolar transistors will be explained as an example.

The MOS transistor MP41 has a source connected to the power supply voltage terminal VDD, a drain connected to the emitter of the bipolar transistor TR41, and a gate connected to the output terminal of the operational amplifier A43. Both the base and the collector of the bipolar transistor TR41 are connected to the ground voltage terminal GND.

The MOS transistor MP42 has a source connected to the power supply voltage terminal VDD, a drain electrically connected to the emitter of the bipolar transistor TR42 via the variable resistance R42, and a gate connected to the output terminal of the operational amplifier A43. Both the base and the collector of the bipolar transistor TR42 are connected to the ground voltage terminal GND.

The operational amplifier A43 generates a voltage in accordance with the potential difference between the drain voltage of the MOS transistor MP41 and the drain voltage of the MOS transistor MP42, and outputs the generated voltage to the gates of the MOS transistors MP41-MP43.

The resistance element R43 is provided between the drain of the MOS transistor MP42 and the ground voltage terminal GND. The MOS transistor MP43 has a source connected to the power supply voltage terminal VDD, a drain connected to the external output terminal OUTa, and a gate connected to the output terminal of the operational amplifier A43. The current that flows between the source and the drain of the MOS transistor MP43 is output to the outside of the reference current generation circuit 41 via the external output terminal OUTa as the reference current Ia. In this example, the size of the MOS transistor MP43 is one time as large as that of the MOS transistor MP42. Therefore, the value of the current flowing between the source and the drain of the MOS transistor MP43 is the same as the value of the current flowing between the source and the drain of the MOS transistor MP42.

The reference current generation circuit 41 is able to adjust the value of the current flowing between the source and the drain of the MOS transistor MP42 by adjusting the resistance value of the variable resistance R42. In accordance therewith, the reference current generation circuit 41 is able to adjust the value of the current flowing between the source and the drain of the MOS transistor MP43. In other words, the reference current generation circuit 41 is able to adjust the current value of the reference current Ia by adjusting the resistance value of the variable resistance R42.

Voltages Vbe1 and Vbe2 between the base and the emitter of the bipolar transistors TR41 and TR42 have a characteristic that it decreases in proportion to a temperature increase, that is, a negative primary temperature characteristic. Accordingly, the reference current generation circuit 41 is able to freely configure the primary temperature characteristic of the reference current Ia by adjusting the resistance value of the variable resistance R42.

(Specific Configuration Example of Reference Current Generation Circuit 42)

Figure 15:
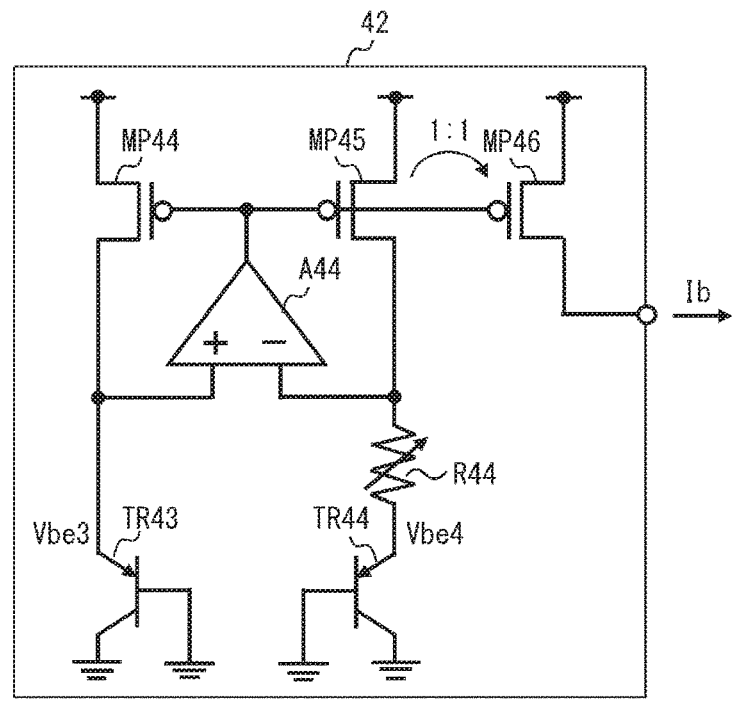
FIG. 15 is a diagram showing a specific configuration example of a second reference current generation circuit provided in the semiconductor device shown in FIG. 13.

FIG. 15 is a diagram showing a specific configuration example of the reference current generation circuit 42.

As shown in FIG. 15, the reference current generation circuit 42 includes an operational amplifier A44, MOS transistors MP44-MP46, bipolar transistors TR43 and TR44, and a variable resistance R44. The operational amplifier A44, the MOS transistors MP44-MP46, the bipolar transistors TR43 and TR44, and the variable resistance R44 respectively correspond to the operational amplifier A43, the MOS transistors MP41-MP43, the bipolar transistors TR41 and TR42, and the variable resistance R42.

That is, the reference current generation circuit 42 is different from the reference current generation circuit 41 in that it does not include the resistance element R43. Since the other configurations of the reference current generation circuit 42 are similar to those of the reference current generation circuit 41, descriptions thereof will be omitted.

The reference current generation circuit 42 is able to adjust the value of the current flowing between the source and the drain of the MOS transistor MP45 by adjusting the resistance value of the variable resistance R44. In accordance therewith, the reference current generation circuit 42 is able to adjust the value of the current flowing between the source and the drain of the MOS transistor MP46. The current that flows between the source and the drain of the MOS transistor MP46 is output to the outside of the reference current generation circuit 42 via the external output terminal OUTb as the reference current Ib. In other words, the reference current generation circuit 42 is able to adjust the current value of the reference current Ib by adjusting the resistance value of the variable resistance R44.

Voltages Vbe3 and Vbe4 between the base and the emitter of the bipolar transistors TR43 and TR44 have a characteristic that it decreases in proportion to a temperature increase, that is, a negative primary temperature characteristic. Accordingly, the reference current generation circuit 42 is able to freely configure the primary temperature characteristic of the reference current Ib by adjusting the resistance value of the variable resistance R44.

Referring back to FIG. 13, the explanation will be continued.

The oscillation circuit 43 includes a resistance element R41, a capacitance element C41, switch elements SW41-SW44, comparators A41 and A42, an SR latch circuit L41, and inverters INV41-INV44.

The resistance element R41 is provided between an external input terminal INa to which the reference current Ia is externally supplied and the ground voltage terminal GND. A voltage Vr of the node between the external input terminal INa and the ground voltage terminal GND is obtained by multiplying the current value of the reference current Ia by the resistance value of the resistance element R41, and is input to the inverting input terminals of the comparators A41 and A42.

The switch element SW41 is provided between an external input terminal INb to which the reference current Ib is externally supplied and a node N41, and the switch element SW41 is controlled to be turned on or off by a signal φ1. The capacitance element C41 is provided between the node N41 and the ground voltage terminal GND. The switch element SW43 is provided in parallel to the capacitance element C41, and the switch element SW43 is controlled to be turned on or off by an inverting signal φ1B of the signal φ1. A voltage Vc1 of the node N41 in accordance with the charges accumulated in the capacitance element C41 is input to the non-inverting input terminal of the comparator A41.

The switch element SW42 is provided between the external input terminal INb and a node N42, and the switch element SW42 is controlled to be turned on or off by a signal φ2. A capacitance element C42 is provided between the node N42 and the ground voltage terminal GND. The switch element SW44 is provided in parallel to the capacitance element C42, and the switch element SW44 is controlled to be turned on or off by an inverting signal φ2B of the signal φ2. A voltage Vc2 of the node N42 in accordance with the charges accumulated in the capacitance element C42 is input to the non-inverting input terminal of the comparator A42.

The comparator A41 compares the voltage Vc1 with the voltage Vr and outputs a comparison result Vcmp1. The comparator A42 compares the voltage Vc2 with the voltage Vr and outputs a comparison result Vcmp2.

Figure 16:
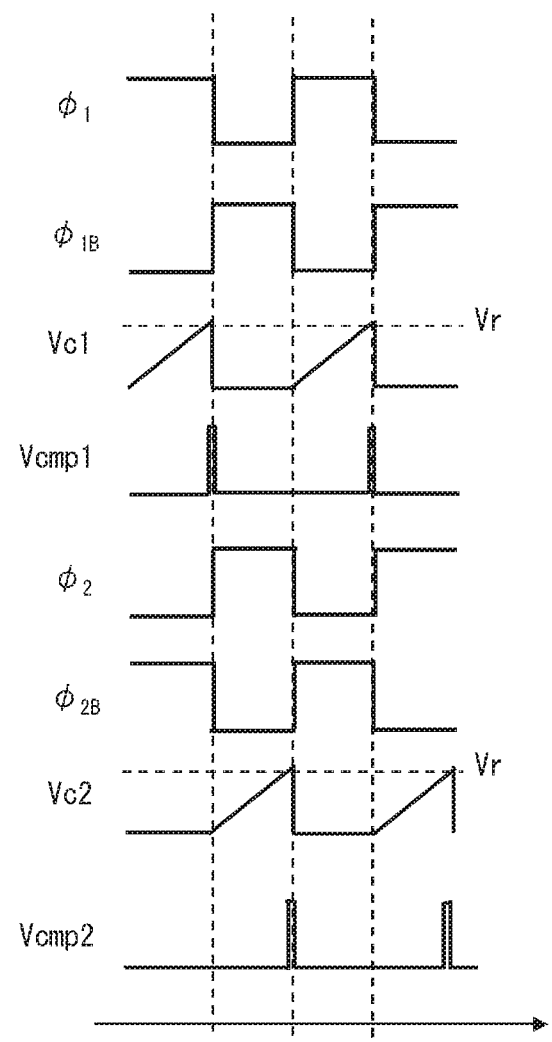
FIG. 16 is a timing chart showing an operation of the semiconductor device shown in FIG. 13.

FIG. 16 is a timing chart showing some operations of the oscillation circuit 43.

As shown in the timing chart in FIG. 16, when, for example, the signal φ1 is in the H level and the signal φ1B is in the L level, the switch element SW41 is turned on and the switch element SW43 is turned off. Therefore, charges of the reference current Ib are accumulated in the capacitance element C41. Therefore, the voltage Vc1 of the node N41 gradually increases. When the voltage Vc1 is smaller than the voltage Vr, the comparator A41 keeps the comparison result Vcmp1 to be the L level. When the voltage Vc1 increases and becomes equal to or larger than the voltage Vr, the comparator A41 switches the comparison result Vcmp1 from the L level to the H level. After that, when the signal φ1 becomes the L level and the signal φ1B becomes the H level, the switch element SW41 is turned off and the switch element SW43 is turned on. Therefore, the charges accumulated in the capacitance element C41 are released toward the ground voltage terminal GND via the switch element SW43. Accordingly, the voltage Vc1 of the node N41 is suddenly reduced. Accordingly, the comparator A41 switches the comparison result Vcmp1 from the H level to the L level.

In a similar way, when, for example, the signal φ2 is in the H level and the signal φ2B is in the L level, the switch element SW42 is turned on and the switch element SW44 is turned off. Therefore, charges of the reference current Ib are accumulated in the capacitance element C42. Accordingly, the voltage Vc2 of the node N42 gradually increases. When the voltage Vc2 is smaller than the voltage Vr, the comparator A42 keeps the comparison result Vcmp2 to be the L level. When the voltage Vc2 increases and becomes equal to or larger than the voltage Vr, the comparator A42 switches the comparison result Vcmp2 from the L level to the H level. After that, when the signal φ2 becomes the L level and the signal φ2B becomes the H level, the switch element SW42 is turned off and the switch element SW44 is turned on. Therefore, the charges accumulated in the capacitance element C42 are released toward the ground voltage terminal GND via the switch element SW44. Accordingly, the voltage Vc2 of the node N42 is suddenly reduced. Accordingly, the comparator A42 switches the comparison result Vcmp2 from the H level to the L level.

The SR latch circuit L41 outputs the oscillation signal and the inverting signal thereof by using the comparison result Vcmp1 as a set signal and using the comparison result Vcmp2 as a reset signal. After the oscillation signal output from the SR latch circuit L41 passes through the inverters INV41 and INV42, the oscillation signal is output to the outside of the oscillation circuit 43 as the oscillation signal CLK. The signals output from the inverters INV41 and INV42 are also used as the signals φ1 and φ1B to control ON and OFF of the switch elements SW41 and SW42, respectively. The inverting signal of the oscillation signal output from the SR latch circuit L41 passes through the inverters INV43 and INV44 and then externally output as the oscillation signal CLKB. The signals output from the inverters INV43 and INV44 are also used as the signals φ2 and φ2B to control ON and OFF of the switch elements SW43 and SW44, respectively.

(Mechanism for Stabilizing Oscillation Signal CLK)

Next, a mechanism for stabilizing the oscillation signal CLK will be explained using calculation expressions.

The reference currents Ia and Ib can be expressed by the following Expressions (46) and (47), respectively. Note that ΔVbe12 indicates the potential difference between the voltage Vbe1 and the voltage Vbe2, and ΔVbe34 indicates the potential difference between the voltage Vbe3 and the voltage Vbe4.

$$Ia = \frac{\Delta V_{be12}}{R_{42}} + \frac{V_{be1}}{R_{43}} \qquad (46)$$

$$Ib = \frac{\Delta V_{be34}}{R_{44}} \qquad (47)$$

For example, the time from when the capacitance element C41 starts to be charged to when the voltage Vc1 reaches the voltage Vr is about the half cycle of the signals φ1 and φ1B (i.e., the oscillation signal CLK). Accordingly, the voltage Vc1 can be expressed as shown in the following Expression (48). Note that C indicates the capacitance value of the capacitance element C41, and f indicates the frequency of the oscillation signal CLK.

$$Vc1 = \frac{\frac{t}{2}Ib}{C} = \frac{Ib\frac{2}{f}}{C} = Vr \qquad (48)$$

From Expression (48), the voltage Vr can be expressed as shown in the following Expression (49).

$$Vr = \frac{Ib\frac{2}{f}}{C} \qquad (49)$$

Since Vr=Ia×R41, the following Expression (50) can be derived from Expression (49).

$$IaR_{41} = \frac{Ib\frac{2}{f}}{C} \qquad (50)$$

From Expression (50), the oscillation frequency f can be expressed as shown in the following Expression (51).

$$f = \frac{2}{R_{41}C}\frac{Ib}{Ia} \qquad (51)$$

As will be understood from Expression (51), the oscillation frequency f depends on the temperature characteristics of Ib/Ia. The symbol Ib/Ia in Expression (51) is similar to the relation of (Va−Vb)/Vb in Expression (1). Accordingly, by adjusting the primary temperature coefficient of the reference current Ia and that of the reference current Ib, not only the influence on the oscillation frequency f of the primary temperature characteristic of the resistance element R41 but also the influence on the oscillation frequency f of the secondary temperature characteristic of the resistance element R41 can be suppressed (canceled).

As described above, the semiconductor device 4 according to this embodiment uses the reference currents Ia and Ib by adjusting the primary temperature coefficients of the reference currents Ia and Ib, whereby it is possible to suppress (cancel) not only the influence on the oscillation frequency f of the primary temperature characteristic of the resistance element R41 but also the influence on the oscillation frequency f of the secondary temperature characteristic of the resistance element R41. Accordingly, the semiconductor device 4 according to this embodiment is able to output the oscillation signal having a stable oscillation frequency regardless of the temperature.

As described above, the semiconductor devices according to the first to fourth embodiments use the reference voltages Va and Vb or the reference currents Ia and Ib by adjusting the primary temperature coefficients thereof, whereby it is possible to suppress (cancel) not only the influence on the oscillation frequency of the primary temperature characteristic of the resistance element provided in the oscillation circuit but also the influence on the oscillation frequency of the secondary temperature characteristic thereof.

While the disclosure made by the present inventors has been specifically described based on the embodiments, it is needless to say that the present disclosure is not limited to the embodiments stated above and may be changed in various ways without departing from the spirit of the present disclosure.

For example, in the semiconductor device according to the above embodiments, the conductive type (p-type or n-type) of each of a semiconductor substrate, a semiconductor layer, or a diffusion layer (diffusion region) may be inverted. Therefore, when one conductive type of the n type and the p type is a first conductive type and the other one of the n type and the p type is a second conductive type, the first conductive type may be the p type and the second conductive type may be the n type and vice versa.

The first to forth embodiments can be combined as desirable by one of ordinary skill in the art.

While the disclosure has been described in terms of several embodiments, those skilled in the art will recognize that the disclosure can be practiced with various modifications within the spirit and scope of the appended claims and the disclosure is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
   a reference voltage generation circuit configured to generate first and second reference voltages capable of adjusting a primary temperature characteristic; and
   an oscillation circuit configured to output an oscillation signal using the first and second reference voltages, wherein
   the oscillation circuit comprises:
      an RC conversion circuit that is driven by the first reference voltage and outputs a current in accordance with a frequency of a feedback signal;
      a control voltage generation circuit configured to generate a control voltage in accordance with a potential difference between a voltage in accordance with the current output from the conversion circuit and the second reference voltage;
      a voltage control oscillation circuit configured to output an oscillation signal having a frequency in accordance with the control voltage; and
      a frequency division circuit configured to divide a frequency of the oscillation signal and output the resulting signal as the feedback signal, wherein the reference voltage generation circuit comprises:
a first operational amplifier configured to amplify a potential difference between a constant voltage and a feedback voltage;
a first resistance element provided between an output terminal of the first operational amplifier and a ground voltage terminal;
a first bipolar transistor provided in series with the first resistance element;
a first switch element configured to select one of voltages of a plurality of nodes on the first resistance element and output the selected one as the first reference voltage;
a second switch element configured to select one of voltages of a plurality of nodes on the first resistance element and output the selected voltage as the feedback voltage; and
a second resistance element provided between a predetermined node on the first resistance element and the ground voltage terminal, and
wherein a voltage of a predetermined node on the second resistance element is output as the second reference voltage.

2. The semiconductor device according to claim 1, further comprising:
a third switch element configured to select one of a plurality of nodes on the first resistance element and connect the selected one to the second resistance element; and
a fourth switch element configured to select one of voltages of a plurality of nodes on the second resistance element and output the selected one as the second reference voltage.

3. The semiconductor device according to claim 1, wherein the reference voltage generation circuit further comprises a feedback capacitance between an output terminal of the first operational amplifier and an input terminal of the first operational amplifier to which the feedback voltage is input.

4. The semiconductor device according to claim 1, comprising:
a wire arranged in a second layer laminated with a first layer in which the first resistance element is arranged; and
a dummy wire arranged in the second layer in such a way as to cover a part of the first resistance element that is not covered with the wire when the dummy wire is seen in a plane view.

5. The semiconductor device according to claim 1, wherein the conversion circuit comprises:
a third resistance element having one end to which the first reference voltage is applied;
first and second capacitance elements provided in another end of the third resistance element; and
a switch unit configured to switch, with respect to first and second capacitance elements, discharging and charging by a charge of a current that flows through the third resistance element based on the feedback signal in a complementary manner.

6. The semiconductor device according to claim 1, wherein the control voltage generation circuit comprises an integrator configured to integrate a potential difference between the second reference voltage and a voltage in accordance with the current output from the conversion circuit and output the resulting voltage as the control voltage.

7. The semiconductor device according to claim 1, wherein the conversion circuit further comprises a voltage follower provided between an external input terminal to which the first reference voltage is externally supplied and an input terminal of the conversion circuit to which the first reference voltage is supplied.

8. A semiconductor device comprising:
a reference voltage generation circuit configured to generate first and second reference voltages capable of adjusting a primary temperature characteristic; and
an oscillation circuit configured to output an oscillation signal using the first and second reference voltages, wherein
the oscillation circuit comprises:
an RC conversion circuit that is driven by the first reference voltage and outputs a current in accordance with a frequency of a feedback signal;
a control voltage generation circuit configured to generate a control voltage in accordance with a potential difference between a voltage in accordance with the current output from the conversion circuit and the second reference voltage;
a voltage control oscillation circuit configured to output an oscillation signal having a frequency in accordance with the control voltage; and
a frequency division circuit configured to divide a frequency of the oscillation signal and output the resulting signal as the feedback signal, wherein
the reference voltage generation circuit comprises:
first to third MOS transistors;
first and second bipolar transistors respectively provided in series with the first and second MOS transistors;
a variable resistance provided between the second MOS transistor and the second bipolar transistor;
an operational amplifier configured to amplify a difference between drain voltages of the first and second MOS transistors and output the amplified voltages to respective gates of the first to third MOS transistors;
a first resistance element and a third bipolar transistor provided in series with the third MOS transistor;
a first switch element configured to select one of voltages of a plurality of nodes on the first resistance element and output the selected one as the first reference voltage; and
a second resistance element provided between a predetermined node on the first resistance element and a ground voltage terminal, and
a voltage of a predetermined node on the second resistance element is output as the second reference voltage.

9. The semiconductor device according to claim 8, further comprising:
a second switch element configured to select one of a plurality of nodes on the first resistance element and connect the selected one to the second resistance element; and
a third switch element configured to select one of voltages of a plurality of nodes on the second resistance element and output the selected one as the second reference voltage.

10. A semiconductor device comprising:
a reference voltage generation circuit configured to generate first and second reference voltages capable of adjusting a primary temperature characteristic; and
an oscillation circuit configured to output an oscillation signal using the first and second reference voltages, wherein the oscillation circuit comprises:
an RC conversion circuit that is driven by the first reference voltage and outputs a current in accordance with a frequency of a feedback signal;
a control voltage generation circuit configured to generate a control voltage in accordance with a potential difference between a voltage in accordance with the current output from the conversion circuit and the second reference voltage;
a voltage control oscillation circuit configured to output an oscillation signal having a frequency in accordance with the control voltage; and
a frequency division circuit configured to divide a frequency of the oscillation signal and output the resulting signal as the feedback signal,
wherein
the reference voltage generation circuit comprises:
a first variable resistance provided between a power supply voltage terminal and a ground voltage terminal;
a second variable resistance provided in series with the first variable resistance and having a primary temperature characteristic different from that of the first variable resistance;
a third variable resistance provided between the power supply voltage terminal and the ground voltage terminal, the third variable resistance being provided separately from the first and the second variable resistances; and
a fourth variable resistance provided in series with the third variable resistance and having a primary temperature characteristic different from that of the third variable resistance,
wherein a voltage of a node on a current path in which the first and second variable resistances are provided is output as the first reference voltage and a voltage of a node on a current path in which the third and fourth variable resistances are provided is output as the second reference voltage.

11. A semiconductor device comprising:
first and second reference current generation circuits configured to generate first and second reference currents capable of adjusting a primary temperature characteristic; and
an oscillation circuit configured to output an oscillation signal using the first and second reference currents, wherein
the oscillation circuit comprises:
a first resistance element configured to convert the first reference current to a voltage;
first and second capacitance elements;
a switch unit configured to switch, with respect to first and second capacitance elements, discharging and charging by a charge of the second reference current based on an oscillation signal in a complementary manner;
a first comparator configured to compare a voltage output from the first resistance element with a voltage of the first capacitance element and output a first comparison result;
a second comparator configured to compare a voltage output from the first resistance element with a voltage of the second capacitance element and output a second comparison result; and
an SR latch circuit configured to output the oscillation signal by using the first comparison result as a set signal and using the second comparison result as a reset signal.

12. The semiconductor device according to claim 11, wherein
the first reference current generation circuit comprises:
first to third MOS transistors;
first and second bipolar transistors respectively provided in series with the first and second MOS transistors;
a first variable resistance provided between the second MOS transistor and the second bipolar transistor;
a second resistance element provided in parallel with the second bipolar transistor and the first variable resistance; and
a first operational amplifier configured to amplify a difference between drain voltages of the first and second MOS transistors and output the amplified voltages to respective gates of the first to third MOS transistors,
a current that flows through the third MOS transistor is output as the first reference current;
the second reference current generation circuit comprises:
fourth to sixth MOS transistors;
third and fourth bipolar transistors respectively provided in series with the fourth and fifth MOS transistors;
a second variable resistance provided between the fifth MOS transistor and the fourth bipolar transistor; and
a second operational amplifier configured to amplify a difference between drain voltages of the fourth and fifth MOS transistors and output the amplified voltages to gates of the fourth to sixth MOS transistors, and
a current that flows through the sixth MOS transistor is output as the second reference current.

* * * * *